(12) United States Patent
Goto

(10) Patent No.: US 6,752,486 B2
(45) Date of Patent: Jun. 22, 2004

(54) LIQUID DROPLET PATTERNING APPARATUS

(75) Inventor: Makoto Goto, Toki (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 85 days.

(21) Appl. No.: 10/256,172

(22) Filed: Sep. 27, 2002

(65) Prior Publication Data

US 2003/0063154 A1 Apr. 3, 2003

(30) Foreign Application Priority Data

Sep. 28, 2001 (JP) ........................................ 2001-302060

(51) Int. Cl.⁷ ............................... A41J 2/15; A41J 2/16
(52) U.S. Cl. .............................. 347/40; 347/49; 347/38
(58) Field of Search ............................. 347/49, 40, 38, 347/44

(56) References Cited

U.S. PATENT DOCUMENTS 5,241,325 A * 8/1993 Nguyen .................... 347/49

FOREIGN PATENT DOCUMENTS

| JP | A 9-300664 | 11/1997 |
|---|---|---|
| JP | A 11-334049 | 12/1999 |
| JP | B2 3121226 | 10/2000 |

* cited by examiner

Primary Examiner—Lamson D Nguyen
(74) Attorney, Agent, or Firm—Oliff & Berridge, PLC

(57) ABSTRACT

A liquid droplet patterning apparatus includes a plurality of support members, rotation servomotors, sliding mechanisms and position adjusting mechanisms. The support members rotatably support nozzle heads. The servomotors rotate the respective nozzle heads about an axis extending in a direction parallel to a liquid droplet ejecting direction of the nozzle heads and orthogonal to a nozzle alignment direction in the nozzle heads, with respect to the support members. The sliding mechanisms slidably support the respective support members in the sub-scanning direction.

20 Claims, 21 Drawing Sheets

FIG.9

| GRADE | INTERNOZZLE DIMENSION ERROR (μm) | CENTER VALUE ERROR (μm) |
|---|---|---|
| 1 | +7.5~+12.5 | +10 |
| 2 | +2.5~+7.5 | +5 |
| 3 | -2.5~+2.5 | 0 |
| 4 | -2.5~-7.5 | -5 |
| 5 | -7.5~-12.5 | -10 |

LIQUID DROPLET PATTERNING APPARATUS

BACKGROUND OF THE INVENTION

1. Field of Invention

The invention relates to a liquid droplet patterning apparatus, and more particularly, technologies for varying an ejection pitch when a recording operation is performed by ejecting liquid droplets, enabling to eject liquid droplets of a plurality of kinds, and finely, precisely adjusting a nozzle head in a sub-scanning direction.

2. Description of Related Art

In recent years, various types of ink-jet printers have been put to practical use. Color ink-jet printers that can perform a recording operation in colors with high resolution at the same level as that of a picture are becoming increasingly common. In the ink-jet printers, a plurality of nozzle heads are attached to a carriage, and, for example, 128 nozzles are provided in each nozzle head so as to align in a row or in a plurality of rows. By ejecting ink droplets from the nozzles, an image is recorded with a dot pattern. Japanese Laid-Open patent publication No. 11-334049 discloses technology for changing a nozzle pitch by rotating the nozzle heads by moving a movable link with respect to a fixed link in order to perform the recording operation in various nozzle pitches.

Commonly, a liquid crystal display is adopted to use with personal computers, word processors, copying machines, facsimile machines, cellar phones, and various portable terminals. Lately, color liquid crystal displays, which can display in color via a color filter, are also used widely. The color filter is provided by which pixels of the primary colors of lights (red R, green G and blue B) are regularly formed with a dot pattern on a transparent film. The color filter can be produced using a liquid droplet patterning apparatus similar to the ink-jet printer.

Japanese Patent No. 3121226 discloses a liquid droplet patterning apparatus for providing the color filter. In the liquid droplet patterning apparatus, a dot pattern is formed on a glass substrate using red, green and blue liquids by ejecting liquid droplets from a plurality of nozzles provided in each of red, blue, and green nozzle heads. Japanese Patent No. 3121226 suggests a technique for performing the recording operation with a dot pitch (ejection pitch), which is narrower than a nozzle pitch, by adjusting the dot pitch by rotating the nozzle heads with respect to a sub-scanning direction. Japanese Patent No. 3121226 also suggests a technique for aligning a recording starting position of the glass substrate by shifting timings of ejection from nozzles no. 1 to no. N when the nozzle heads are rotated, and a technique for controlling ejection timings so as to correct a positional deviation of each nozzle from a center line of the plurality of the nozzles in each nozzle head.

Japanese Laid-Open Patent Publication 9-300664 discloses a liquid droplet patterning apparatus that provides a color filter used for the color liquid crystal display. In this apparatus, red, green and blue nozzle heads, having a plate-shape and extending in a direction perpendicular to a glass substrate, are disposed in parallel with a sub-scanning direction.

Both ends of each of the nozzle heads are supported by a holder. One end of each holder is rotatably connected to a head mount (frame) by a rotational shaft, and the other end is rotatably connected to a sliding member by a rotational shaft. Each of the nozzle heads is urged toward the one end of each nozzle head by a coil spring, and can be adjusted in its position with respect to the one end of the holders using a fine adjustment screw. In addition, a fine adjustment screw for finely moving the sliding member with respect to the head mount is provided. By adjusting a position of the sliding member in a main scanning direction using the fine adjustment screw, a rotation angle of the three nozzle heads with respect to the sub-scanning direction is changed to adjust a dot pitch in the sub-scanning direction appropriately.

An organic electroluminescence (EL) display has been put into practical use as a next-generation display substitute for the above-described liquid display. An EL substrate used for an organic EL display is, for example, a glass substrate, on which an anode layer, a hole transport layer, an emitter layer, and a cathode layer are formed. Various luminescent organic compounds are applied as the emitter layer according to desired luminescent colors. In the emitter layer of the EL substrate for the color EL display, red (R), green (G) and blue (B) luminescent elements are regularly formed into a dot pattern. The organic EL display has a slim body, is lightweight and low in cost as well as having a simple structure. In addition, the organic EL display offers excellent visibility through a wide viewing angle and needs little power.

The EL substrate for the organic color EL display is produced as described below. Liquid droplets for forming a hole transport layer are ejected onto a glass substrate from the nozzle heads of the liquid droplet patterning apparatus, and then the liquid droplets on the glass substrate are fixed by heat in a vacuum or an inert atmosphere (gas). After that, three kinds of liquids corresponding to R, G, B, for forming an EL emitter layer, are ejected from the three nozzle heads onto the glass substrate to form a dot pattern. Next, heat is applied to the dot pattern in the vacuum, and then an electrode layer (cathode layer) is formed thereon by evaporating aluminum.

Japanese Laid-Open Patent Publication No. 11-334049 discloses the ink-jet printer that rotates the nozzle heads by moving the movable link with respect to the fixed link. Therefore, in order to maintain the nozzle heads at the rotated position, at least the fixed link, the movable link and the nozzle heads need to be attached to the head mount. In this structure, however, because the movable link moves along an arc with respect to the fixed link, the structure of the ink-jet printer becomes complicated. Accordingly, it should become difficult to design a nozzle head unit including nozzle heads.

Japanese Patent No. 3121226 does not disclose a mechanism for supporting the nozzle heads so that the nozzle heads can rotate with respect to the sub-scanning direction, nor an actuator for rotating the nozzle heads. A plurality of the nozzle heads are not detachably attached as a nozzle head unit. Japanese Patent No. 3121226 does not mention a center of rotation when the nozzle heads are rotated.

Japanese Laid-Open Patent Publication No.9-300664 discloses the liquid droplet patterning apparatus that requires three nozzle heads deposed in a standing posture, so that the shape of the nozzle heads is limited. When the nozzle heads are designed such that the nozzle heads can be attached to and detached from the holders at both ends from above, it is difficult to precisely set a position of the nozzle heads in a vertical direction. On the other hand, when the nozzle heads are designed such that the nozzle heads cannot be attached to and detached from the holders at both ends from above, it becomes difficult to remove the nozzle heads easily when the nozzle heads are repaired or replaced. Thus, the maintainability cannot be ensured.

Further, in the liquid droplet patterning apparatus, the sliding member needs to be moved in the main scanning direction by manually operating the fine adjustment screw, every time a dot pitch (ejection resolution) in the sub-scanning direction is changed. Therefore, it is impossible to set a maximum rotation angle for inclining the nozzle heads to a very large angle. Thus, a range of the dot pitch that can be accomplished by the rotation of the nozzle heads becomes narrow.

SUMMARY OF THE INVENTION

The invention provides a liquid droplet patterning apparatus wherein a nozzle head is easily attached and detached, maintainability of the nozzle head is improved, a variable range of an ejection pitch is extended by extending a range of a rotation angle that the nozzle head can rotate, and an adjustment of an ejecting position is easily performed by nozzle by moving the nozzle head in a sub-scanning direction regardless of the rotation angle of the nozzle head.

According to one aspect of the invention, a liquid droplet patterning apparatus includes a plurality of nozzles that eject liquid droplets onto a recording medium, a plurality of nozzle heads aligned in a main scanning direction, at predetermined intervals, a plurality of rotation devices, a plurality of sliding mechanisms and a plurality of position adjusting devices. The plurality of the nozzle heads have the plurality of the nozzles aligned in a sub-scanning direction orthogonal to the main scanning direction. The plurality of the support members rotatably support the respective nozzle heads. The plurality of the rotation devices rotate the respective nozzle heads about an axis extending in a direction parallel to the liquid droplet ejecting direction and orthogonal to the nozzle alignment direction, with respect the support members. The plurality of the sliding mechanisms slidably support the plurality of the support members in the sub-scanning direction. The plurality of the position adjusting devices finely adjust the respective support members, which support the nozzle heads, via the sliding mechanisms, in the sub-scanning direction.

BRIEF DESCRIPTION OF THE DRAWINGS

An embodiment of the invention will be described in detail with reference to the following figures wherein:

FIG. 9 is a table showing the internozzle dimension error and its center value error ranked into several grades;

DETAILED DESCRIPTION OF PREFERRED EMBODIMENTS

An exemplary embodiment of the invention will be described with reference to the accompanying drawings. In this embodiment, the invention is applied to a liquid droplet patterning apparatus that produces an electroluminescence (EL) substrate (which is a thin glass plate on which an emitter layer for emitting light of three colors (red, green and, blue) is formed) used for an organic EL display device.

Figure 7:
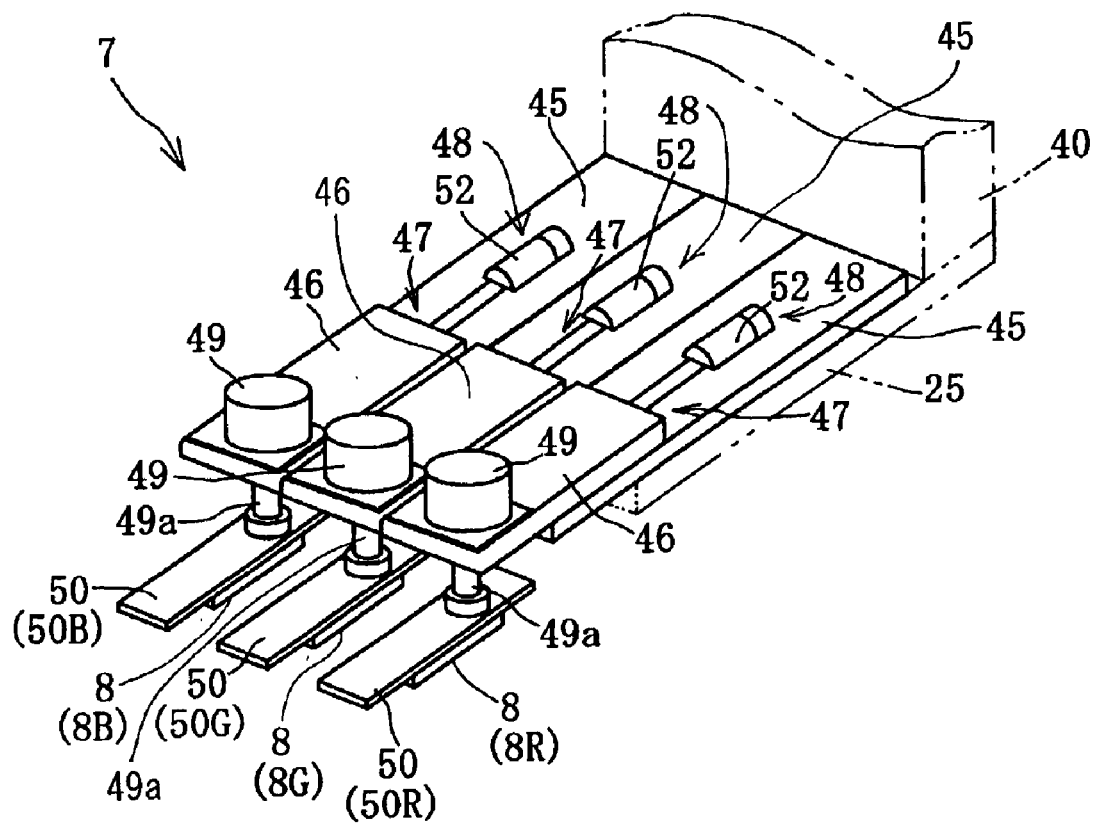
FIG. 7 is a perspective view of a nozzle head holding mechanism.
Figure 10:
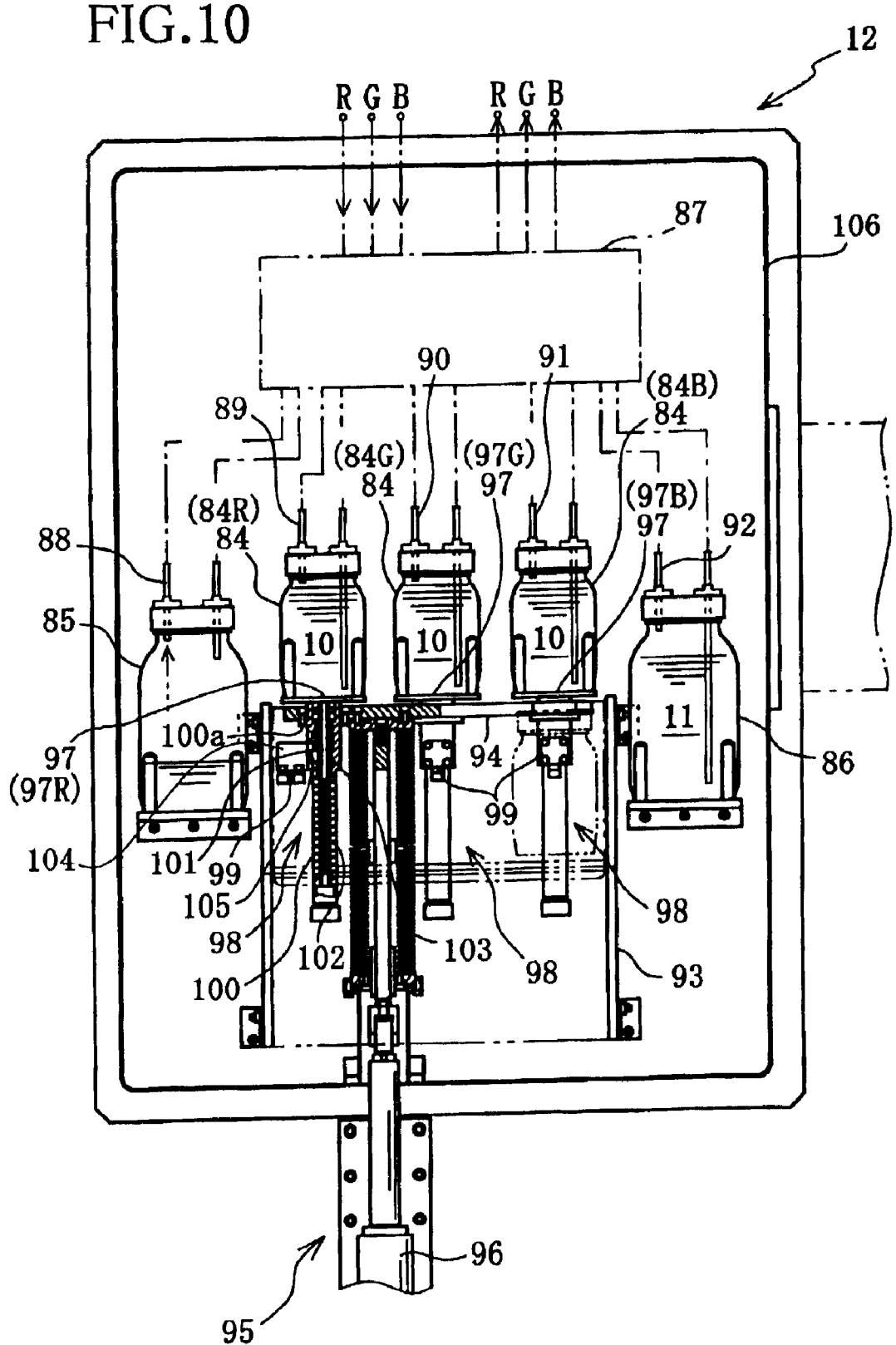
FIG. 10 is a front view of a liquid supply mechanism.
Figure 20:
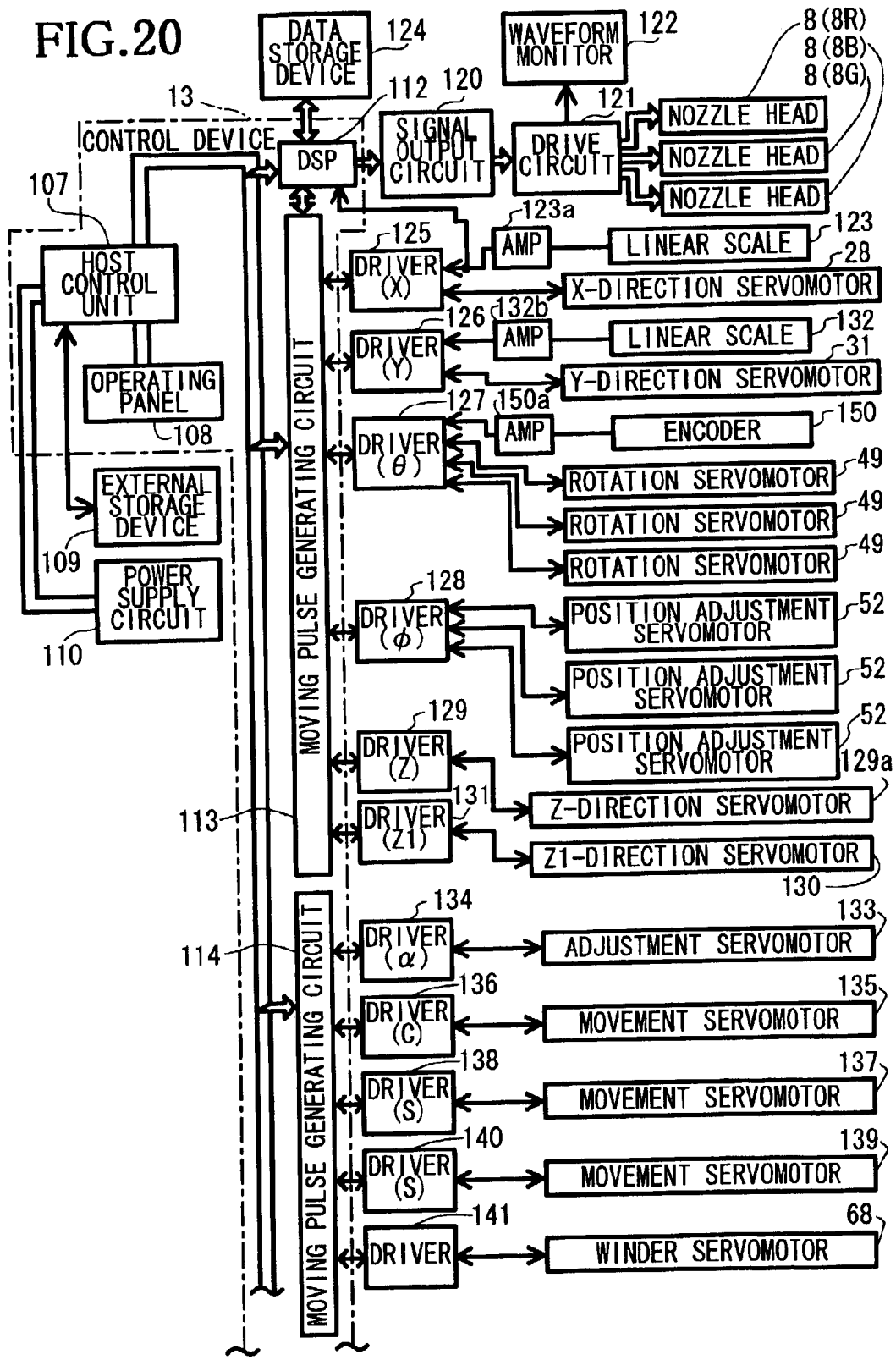
FIG. 20 is a block diagram of a control system of the liquid droplet patterning apparatus.

A liquid droplet patterning apparatus 1 includes a base frame 2 (FIG. 1), a casing 3 (FIG. 1), a medium holding/moving device 5 (FIG. 4), a Z-direction head holder moving mechanism 6 (FIG. 1), a nozzle head holding device 7 (FIG. 1), a checking/adjusting device 9 (FIG. 3), a liquid supply device (liquid supply mechanism) 12 (FIG. 1), and a control device 13 (FIG. 20). The medium holding/moving device 5 holds a glass substrate (recording medium) 4 and can independently move the glass substrate 4 in main and sub-scanning directions. The Z-direction head holder moving mechanism 6 holds the nozzle head holding device 7 so that the nozzle head holding device 7 can move in up-and-down directions. The checking/adjusting device 9 checks an ejection condition of liquid droplets from nozzle heads 8 (FIG. 5) and performs maintenance and adjustment on the nozzle heads 8. The nozzle heads 8 include nozzle heads 8R, 8G, 8B (FIG. 7). The liquid supply device 12 supplies liquid 10 to be ejected for forming an EL emitter layer of three colors and a flushing solvent 11 (FIG. 10). The control device 13 controls the above-described devices and mechanisms.

A description will be made in the embodiment using directions shown in FIG. 2 of the liquid droplet patterning apparatus 1 and as are applied throughout several drawings. A right and left direction, a front to rear direction, and an up and down direction are referred to as an X-direction (main scanning direction), a Y-direction (sub-scanning direction), and a Z-direction, respectively.

As shown in FIGS. 1 to 4, in the liquid droplet patterning apparatus 1, the rectangular parallelepiped casing 3 is disposed on the base frame 2. The inside of the casing 3 is divided into a patterning room 15 and a maintenance room 16 by a partition 14 horizontally provided at an intermediate position. The patterning room 15 is disposed on the side of the base frame 2, and the maintenance room 16 is disposed above the patterning room 15. The partition 14 has an opening 14a (FIG. 2) through which the nozzle head holding device 7 can pass. Anything is useful as the partition 14 and the partition 14 may not be horizontally disposed as long as it separates the patterning room 15 and the maintenance room 16 from each other. On a patterning stage in the patterning room 15, a recording operation is performed on the glass substrate 4 to form a dot pattern including a plurality of fine pixels of the three colors. On a checking/adjusting stage 44 in the maintenance room 16, checking and adjusting operations are performed on the nozzle heads 8.

First, the medium holding/moving device 5 will be described. The medium holding/moving device 5 receives the glass substrate 4, which is conveyed from a loader H disposed behind an external system in a direction indicated by an arrow A, shown in FIG. 2, at a predetermined passing position (standby position) 21b indicated by a double dashed chain line in FIG. 2, then moves the glass substrate 4 to an ejection start position, and aligns the glass substrate 4 with an initial set position (home position). During the recording operation, the medium holding/moving device 5 moves the glass substrate 4 in the X- and Y-directions independently. After the recording operation, the medium holding/moving device 5 moves the glass substrate 4 to the standby position to pass the glass substrate 4 to the loader H.

Figure 1:
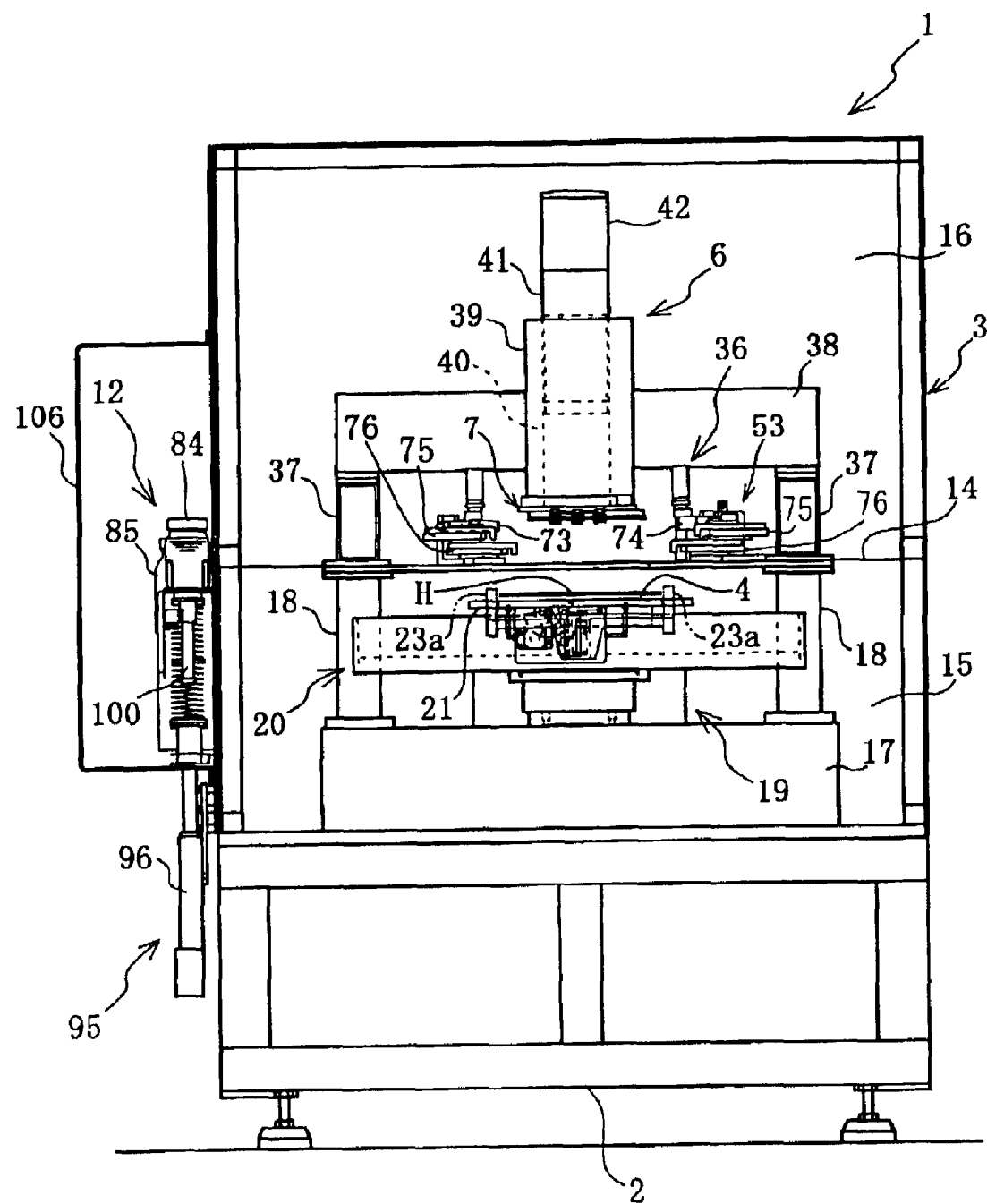
FIG. 1 is a front view of a liquid droplet patterning apparatus of an embodiment of the invention.
Figure 4:
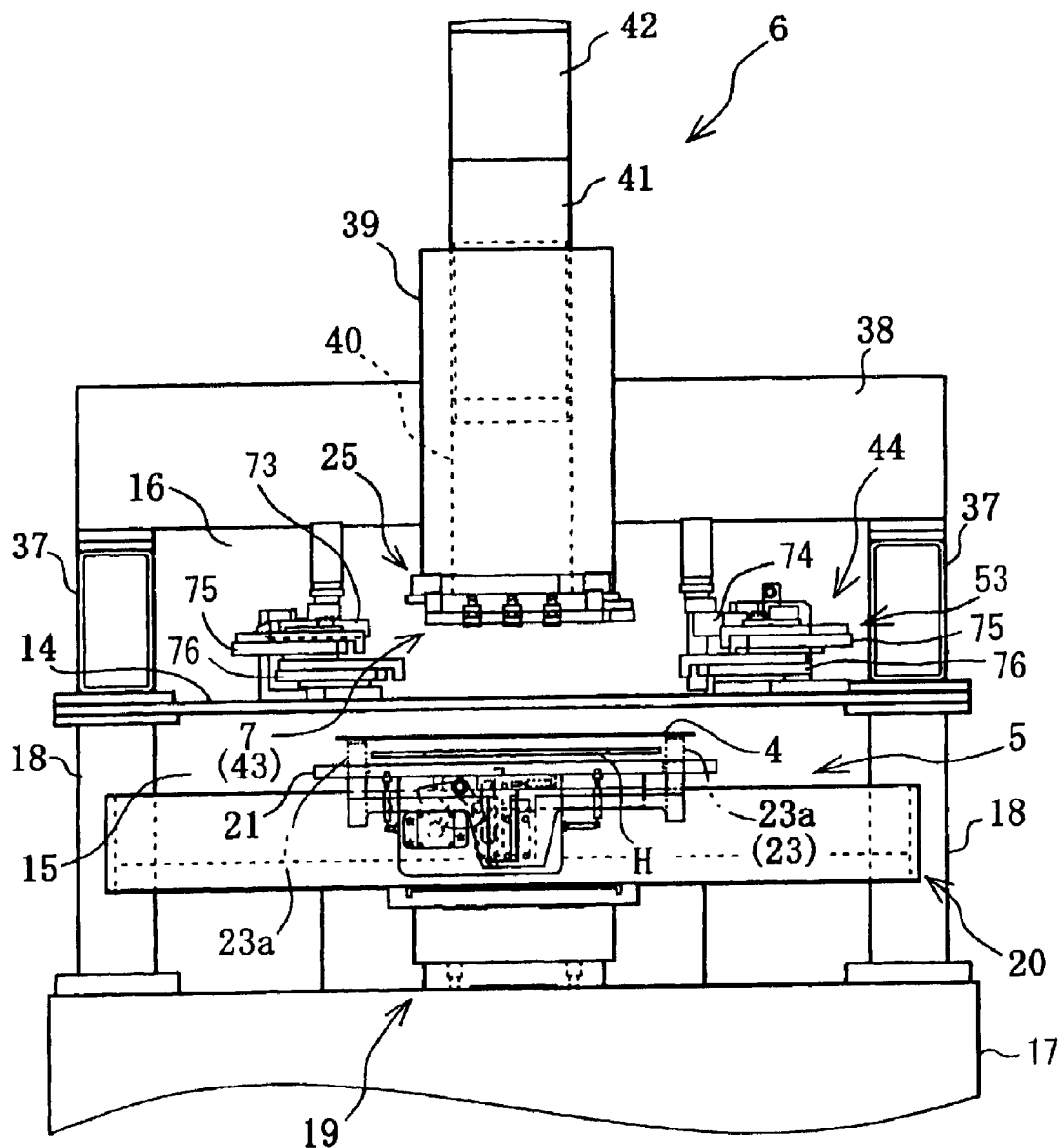
FIG. 4 is an enlarged front view of the liquid droplet patterning apparatus.

As shown in FIGS. 1 and 4, a marbled base 17 is provided on the base frame 2 in the patterning room 15 (for example, 1500 mm in length, 1500 mm in width, and 500 mm in height). Columns 18 extend from the four corners on the base 17. In the patterning room 15, air is substituted for nitrogen gas and water vapor concentration and oxygen concentration are reduced to a predetermined level or lower to perform the recording operation.

Figure 5:
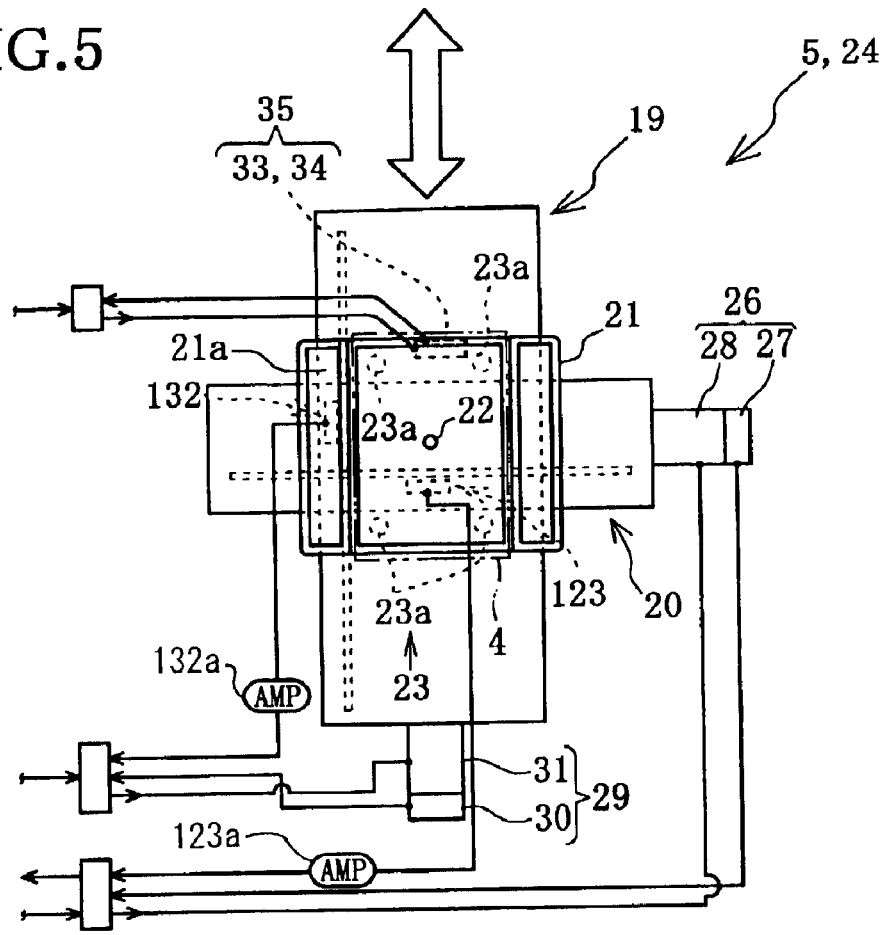
FIG. 5 is a plan view of a medium holding/moving device, a substrate holder, and X- and Y-direction substrate moving mechanisms.
Figure 6:
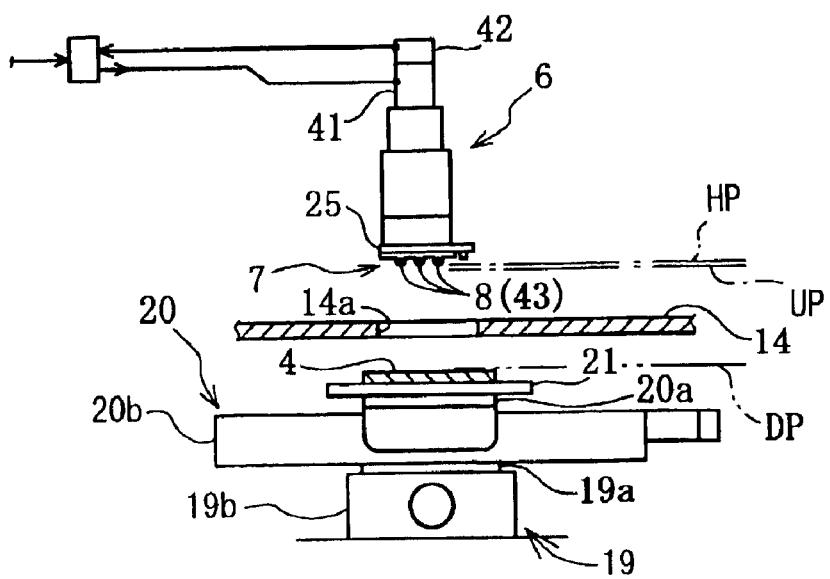
FIG. 6 is an explanatory diagram showing a raised position of a head portion of nozzle heads.

As shown in FIGS. 4 to 6, a Y-direction substrate moving mechanism 19 is disposed on the base 17. An X-direction substrate moving mechanism 20 is attached to a movable member 19a of the Y-direction substrate moving mechanism 19. A substrate holder 21, which holds the glass substrate 4 thereon, is attached to a movable member 20a of the X-direction substrate moving mechanism 20. The X- and Y-direction substrate moving mechanisms 19, 20 can separately move the glass substrate 4 in the X- and Y-directions. The substrate holder 21 can rotate about the center of a pin 22 to align the glass substrate 4.

The substrate holder 21 is made of porous material of synthetic resin or sintered metal, so that the substrate holder 21 can adhere and hold the glass substrate 4 by applying a negative pressure to the glass substrate 4 via the substrate holder 21 made of the porous material. The substrate holder 21 has a wider width, in the right and left direction, than the glass substrate 4. A pair of trays 21a, which receive the flushing solvent (solvent for cleaning the nozzle head 8) 11, are integrated with the substrate holder 21. Four lift bars 23a and a substrate lifting mechanism 23 (FIG. 5) are provided. The lift bars 23a lift the glass substrate 4 by a predetermined distance from the substrate holder 21 when the glass substrate 4 is conveyed to/from the substrate holder 21. The substrate lifting mechanism 23 includes an air cylinder that moves the lift bars 23a up and down.

The X-direction substrate moving mechanism 20 and the Y-direction substrate moving mechanism 19, as a medium conveying mechanism 24 (FIG. 5), will be described. As shown in FIGS. 1 and 4 to 6, the substrate holder 21 and the glass substrate 4, disposed on the substrate holder 21, can be moved in the main scanning direction by the X-direction substrate moving mechanism 20 and can be also moved in the sub-scanning direction by the Y-direction substrate moving mechanism 19. When a pattern is formed on the glass substrate 4, the glass substrate 4 and the nozzle heads 8 of the nozzle head holding mechanism 7 are moved with respect to each other in the main and sub-scanning directions by the substrate moving mechanisms 19, 20 while the nozzle head holding device 7 is held at a predetermined descent position.

An X-direction drive 26 of the X-direction substrate moving mechanism 20 moves the movable member 20a by a servomotor 28, including an X-direction encoder 27, with respect to an X-direction guide member 20b. A Y-direction drive 29 of the Y-direction substrate moving mechanism 19 moves the movable member 19a by a servomotor 31, including a Y-direction encoder 30, with respect to a Y-direction guide member 19b.

Figure 15:
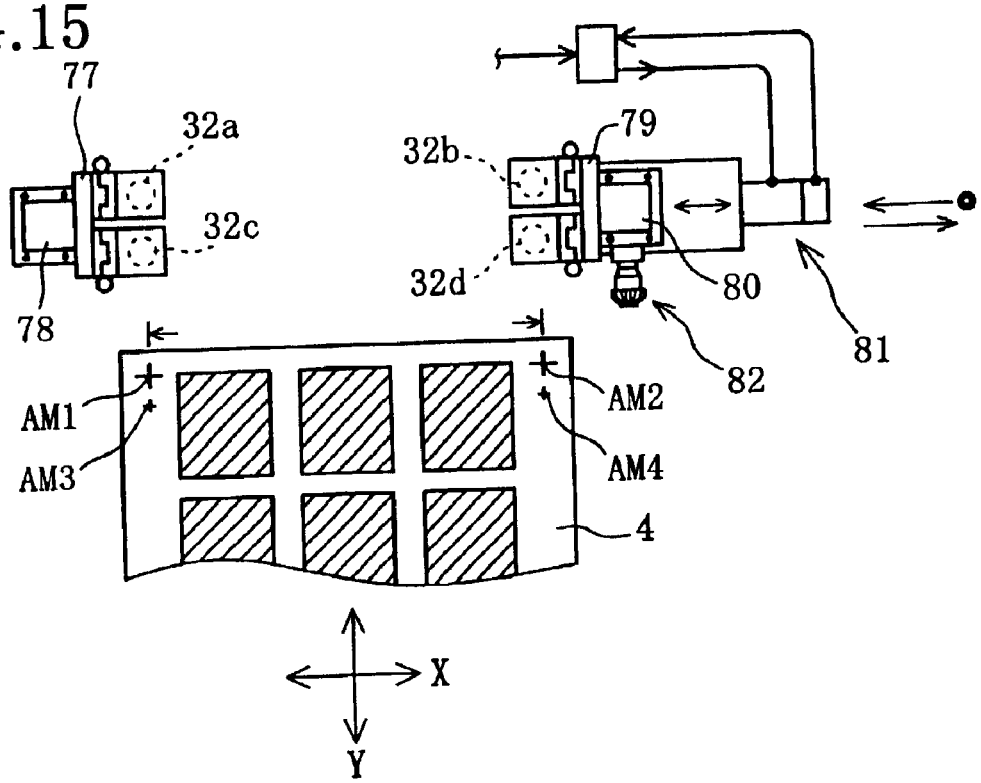
FIG. 15 is an explanatory diagram showing the glass substrate on the substrate holder and an automatic alignment mechanism.

When the glass substrate 4 on the substrate holder 21 is aligned at the home position, first, positions of alignment marks AM1 to AM4 (FIG. 15) provided on the glass substrate 4 are detected by scanning the alignment marks AM1 to AM4 using CCD cameras 32a to 32d provided in the maintenance room 16. Based on the detected position information of the alignment marks AM1 to AM4, the substrate holder 21 is moved in the X- and Y-directions by the substrate moving mechanisms 19, 20 and rotated about the pin 22 by a rotating device 35, which includes a cam piece 33 frictionally engaged with the underside of the substrate holder 21 and an electric cylinder 34 capable of slightly moving the cam piece 33 in the X-direction. As described above, the glass substrate 4 is adjusted to the initial set position using the alignment marks AM1 to AM4.

That is, the X- and Y-direction substrate moving mechanisms 19, 20, the rotating device 35, the CCD cameras 32a to 32d, and the control device 13 constitute an automatic alignment mechanism 36 that adjusts the glass substrate 4 to the initial set position using the alignment marks AM1 to AM4 of the glass substrate 4.

As shown in FIGS. 1 to 4 and 6, the Z-direction head holder moving mechanism 6 supports and moves the nozzle head holding device 7 in the up and down directions. A pair of box frames 37, extending in the front to rear direction, are supported on the columns 18 at the right and left sides of the partition 14 in the maintenance room 16. A support frame 38 is provided on the box frames 37 so as to bridge between the two box frames 37. The Z-direction head holder moving mechanism 6 is attached to the support frame 38. The Z-direction head holder moving mechanism 6 includes a sliding case 39 fixed to the support frame 38, a movable member 40 movably guided in the up and down directions by the sliding case 39, an electric cylinder 41 for moving the movable member 40 in the up and down directions, and a Z-direction encoder 42 for the electric cylinder 41.

As shown in FIGS. 1, 4, 6 and 7, a head mount 25 is fixed to the lower end of the movable member 40 of the Z-direction head holder moving mechanism 6. The nozzle head holding device 7 is detachably attached to the head mount 25. As shown in FIG. 6, a head portion 43, including the plurality of nozzle heads 8, of the nozzle head holding device 7, is moved up and down among an ejection position (descent position) DP, an check/alignment position (raised position) UP, and a home position HP. The ejection position DP is a position where a pattern is formed on the glass substrate 4 on the patterning stage provided under the partition 14, in the patterning room 15. The check/adjustment position UP is a position where the head portion 43 is checked and adjusted on the checking/adjusting stage 44. The home position HP is provided at a position slightly higher than the check/adjustment position UP.

As shown in FIGS. 1, 4 and 7, the nozzle head holding device 7 includes base plates 45, support members 46, sliding mechanisms 47, position adjusting mechanisms 48, rotation servomotors 49, and head holders 50.

Figure 8:
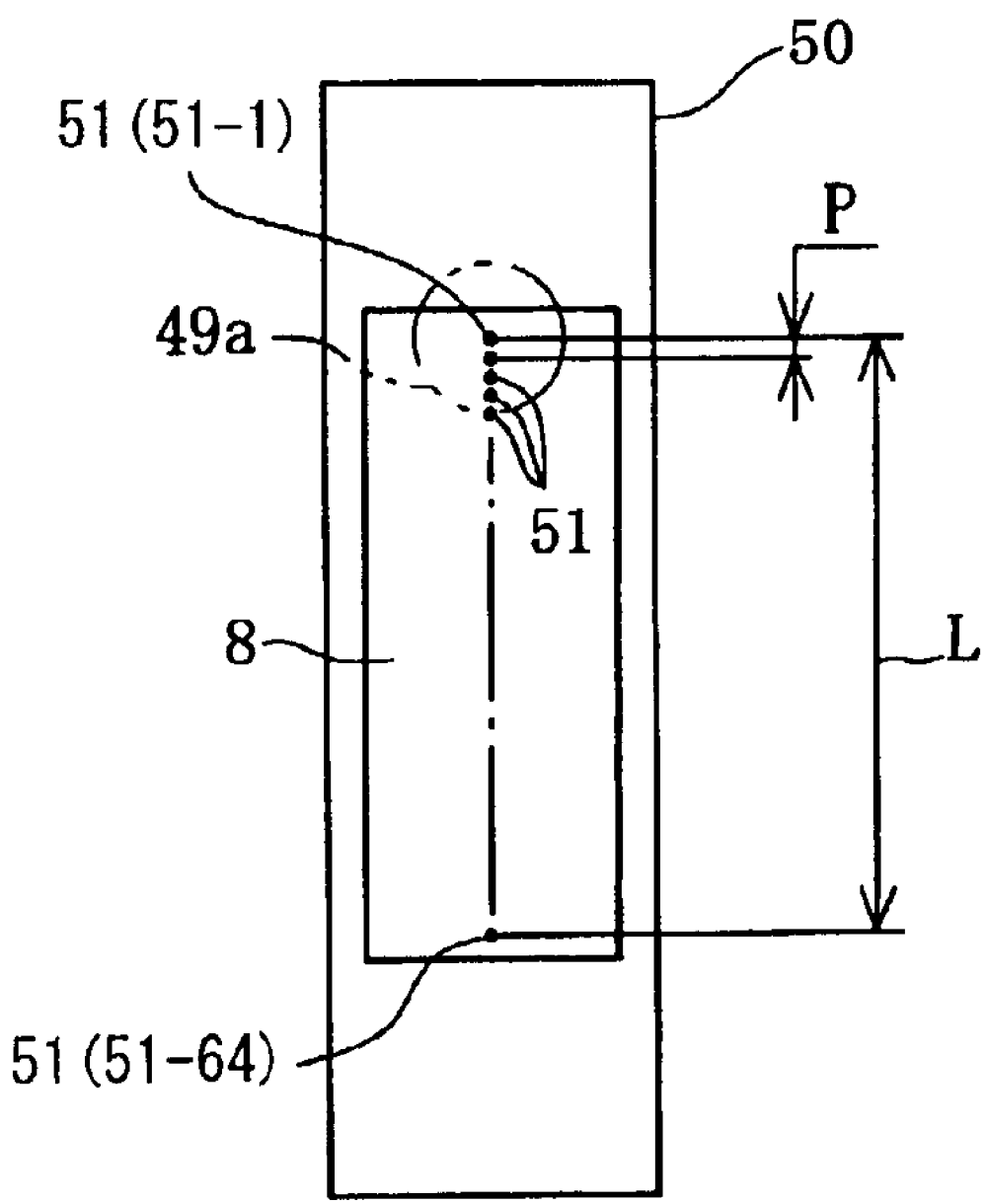
FIG. 8 is an explanatory diagram for an internozzle dimension error and a nozzle pitch error in the nozzle head.

The head holders 50 are narrow and extend in the sub-scanning direction. When the head holders 50 are in an initial set state, surfaces of the head holders 50 extend in parallel with the sub-scanning direction. The narrow nozzle heads 8, extending in the sub-scanning direction and are detachably attached to the respective head holders 50. The nozzle heads 8 are made of solvent-resistant material (preferably ceramic material) in order to eject a solvent made of a solution and an organic substance, such as an EL light-emitting organic substance. The solvent-resistance means a property of resisting corrosion by the solvent. Each of the nozzle heads 8 has, for example, sixty-four nozzles 51 having an extremely small diameter. The nozzles 51 are aligned in a line, with an extremely small pitch, in the sub-scanning direction (FIG. 8). The head holders 50 include head holders 50R, 50G, 50B, which have attached thereto the nozzle heads 8R, 8G, 8B, which eject red liquid, green liquid and blue liquid, respectively. The head holders 50R, 50G, 50B are disposed in parallel with each other, at predetermined intervals, in the main scanning direction. From the rearmost nozzle 51 (disposed on a base end side), the nozzles 51 are serially numbered from one to sixty-four in each nozzle head 8. The headmost nozzle 51 is referred to as the nozzle no. 64. The nozzle no. 1 is a reference nozzle 51-1.

The three rectangular base plates 45, extending in the sub-scanning direction, are provided adjacent to each other on the head mount 25, so as to protrude from the front end of the head mount 25. The three support members 46 are slidably attached to the substantially the front half of the respective base plates 45 via the sliding mechanisms 47. Each of the base plates 45 is provided with the position adjusting mechanism 48, which includes a position adjustment servomotor 52 disposed in the front to rear direction. A position of each support member 46 connected with a movable member (not shown) of each sliding mechanism 47 can be finely adjusted in the sub-scanning direction by the associated position adjusting mechanism 48.

The rotation servomotor 49, having an output shaft 49a extending downward, is fixedly attached to the front end of each of the support members 46. Each of the head holders 50 is attached to the end of the output shaft 49a of the rotation servomotor 49. The head holders 50, that is, the nozzle heads 8, are rotated about an axis extending in a direction parallel to a liquid ejecting direction and orthogonal to a nozzle alignment direction, by the servomotors 49, at the same time, with respect to the support members 46. At that time, as shown in FIG. 8, the nozzle heads 8 are rotated about a position where the reference nozzle (nozzle no. 1) 51-1 is disposed, as a center of rotation. The control device 13 controls a rotation angle of the nozzle heads 8 to be rotated by the rotation servomotors 49 based on a resolution of the pattern formation.

The nozzle heads 8 attached to the nozzle head holding device 7 include nozzle heads that eject liquid droplets of the plurality of colors to form an EL emitter layer that emits light in predetermined colors. In the embodiment, the nozzle heads 8 include the nozzle heads 8R, 8G, 8B that eject red, green and blue liquids, respectively, to form an EL emitter layer in full color. The red, green and blue liquids are supplied to the corresponding nozzle heads 8R, 8G, 8B via tubes from the liquid supply mechanism 12 (FIG. 10) to eject liquid droplets from the plurality of the nozzles 51.

As shown in FIGS. 8 and 9, an internozzle dimension error, which is an amount of error from a design value of an internozzle dimension L, which is a distance between the headmost nozzle 51–64 and the rearmost nozzle 51-1, is ranked on a scale of 1 to 5. Nozzle heads 8R, 8G, 8B, which are all ranked in the same grade of internozzle dimension error, are attached to the nozzle head holding device 7. When the nozzle heads 8 are rotated by the rotation servomotors 49 by an arbitrary angle within a range of between 0 and 60 degrees, the rotation angle is corrected in accordance with a central value error in the grade of internozzle dimension error of the nozzle heads 8R, 8G, 8B. By using a correction program prestored in the control device 13, the rotation angle is corrected using one of the central value errors (+10, +5, 0, −5, −10 $\mu$m) in the grades 1 to 5, when the rotation angle of the nozzle heads 8 is calculated. Instead of the internozzle dimension error, a nozzle pitch error between adjacent nozzles (i.e. a value obtained by dividing the internozzle dimension error by the number of spaces between nozzles) can be used. Although the nozzle heads 8R, 8G, 8B of the same grade of internozzle dimension error are used in this embodiment, the nozzle heads 8R, 8G, 8B can be chosen from different grades. The rotation servomotors 49 are provided to the nozzle heads 8 in a one-to-one relationship. Accordingly, errors of the nozzle heads 8 in the different grades can be individually corrected so that a nozzle pitch of all the nozzle heads 8 becomes the same pitch.

Next, the maintenance room 16 and equipment and devices provided in the maintenance room 16 will be described. The position of the head portion 43 is switched to the raised position UP (FIG. 6) by the Z-direction head holder moving mechanism 6, by passing through the opening 14a of the partition 14, and is maintained at the raised position to check an ejection condition of the nozzles 51 and to perform maintenance. In the maintenance room 16, the ejection condition of the nozzles 51 of each of the nozzle heads 8R, 8G, 8B is checked using an ejection check mechanism 53 and the maintenance is performed on the nozzle head holding device 7.

As shown in FIGS. 1 to 4 and 6, the maintenance room 16 has a length of 1500 mm, a width of 1500 mm, and a height of 700 mm, for example. The maintenance room 16 contains the major portion of the Z-direction head holder moving mechanism 6, a part of an automatic alignment mechanism 36, and the checking/adjusting device 9 for checking and maintaining the nozzle heads 8 of the head holders 50. The checking/adjusting device 9 includes a head maintenance mechanism 54 and the ejection check mechanism 53.

As shown in FIGS. 1 to 4 and 16, the head maintenance mechanism 54 is provided at the front of the opening 14a of the partition 14, in the maintenance room 16. The head maintenance mechanism 54 has an electric cylinder 55, an absorbing sheet winding mechanism 56, a sheet winder driving mechanism 57, a purge tray 58, and a rubber pad unit 59. The head maintenance mechanism 54 cooperates with the ejection check mechanism 53 when the ejection condition of the nozzles 51, aligned in the sub-scanning direction of the nozzle heads 8, is checked by the ejection check mechanism 53.

A movable table 60 integrally supports the absorbing sheet winding mechanism 56, the purge tray 58 and the rubber pad unit 59 thereon. The movable table 60 is moved in the front and rear direction by the electric cylinder 55 so that the absorbing sheet winding mechanism 56, the purge tray 58 and the rubber pad unit 59 can be placed under the nozzle heads 8 supported by the nozzle head holding device 7 maintained at the raised position UP by the Z-direction head holder moving mechanism 6.

Figure 2:
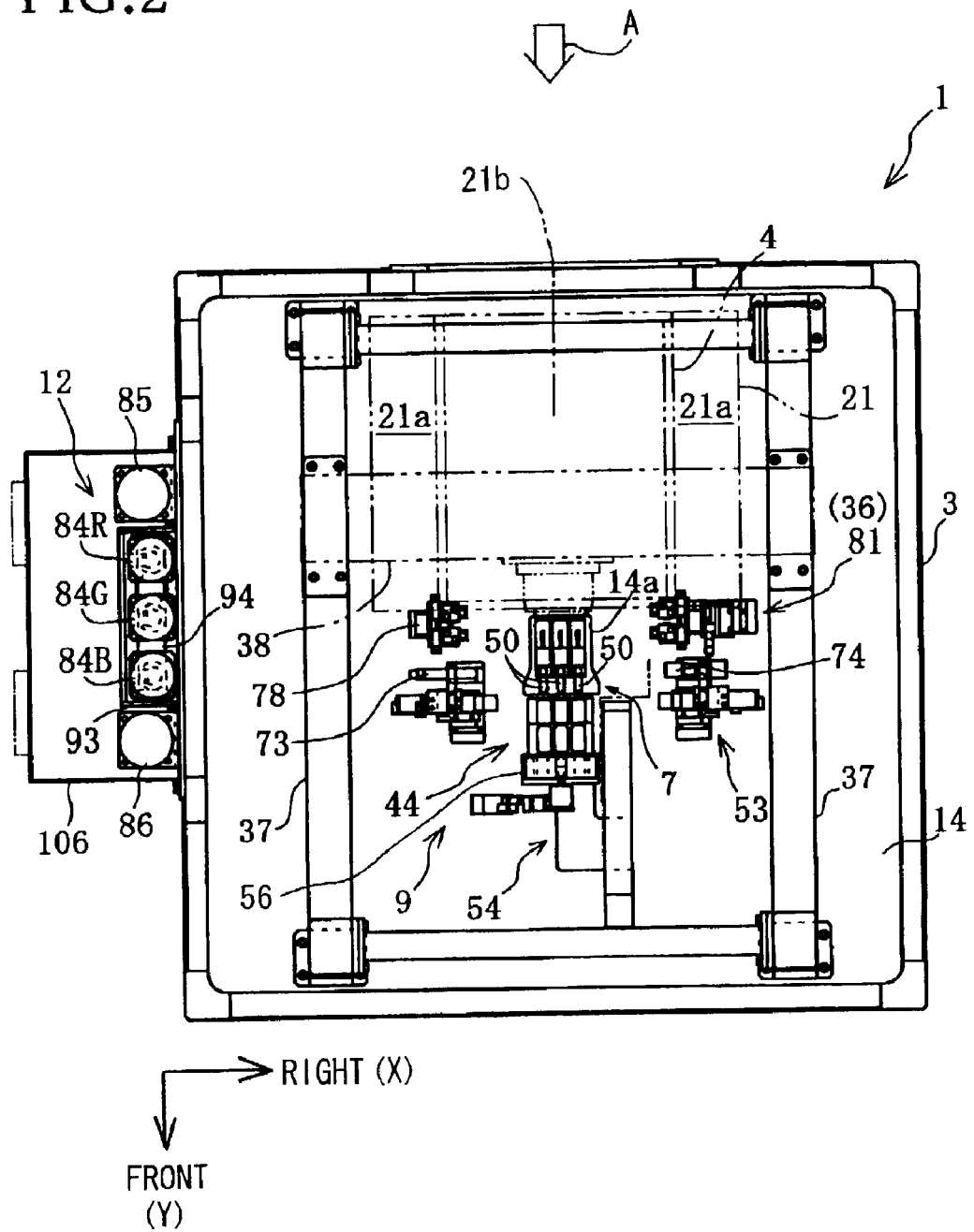
FIG. 2 is a plan view of the liquid droplet patterning apparatus.
Figure 3:
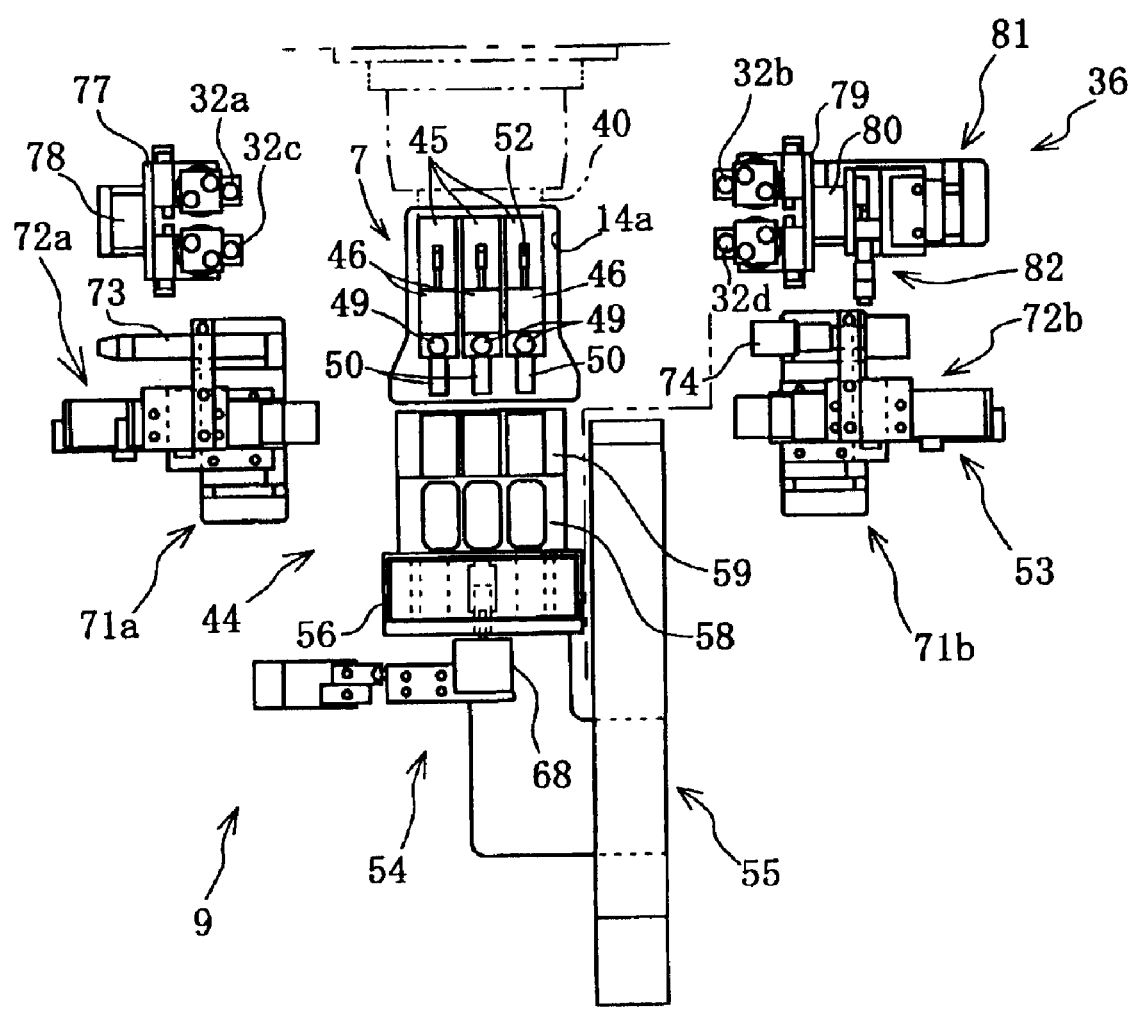
FIG. 3 is an enlarged plan view of essential parts of the liquid droplet patterning apparatus.
Figure 16:
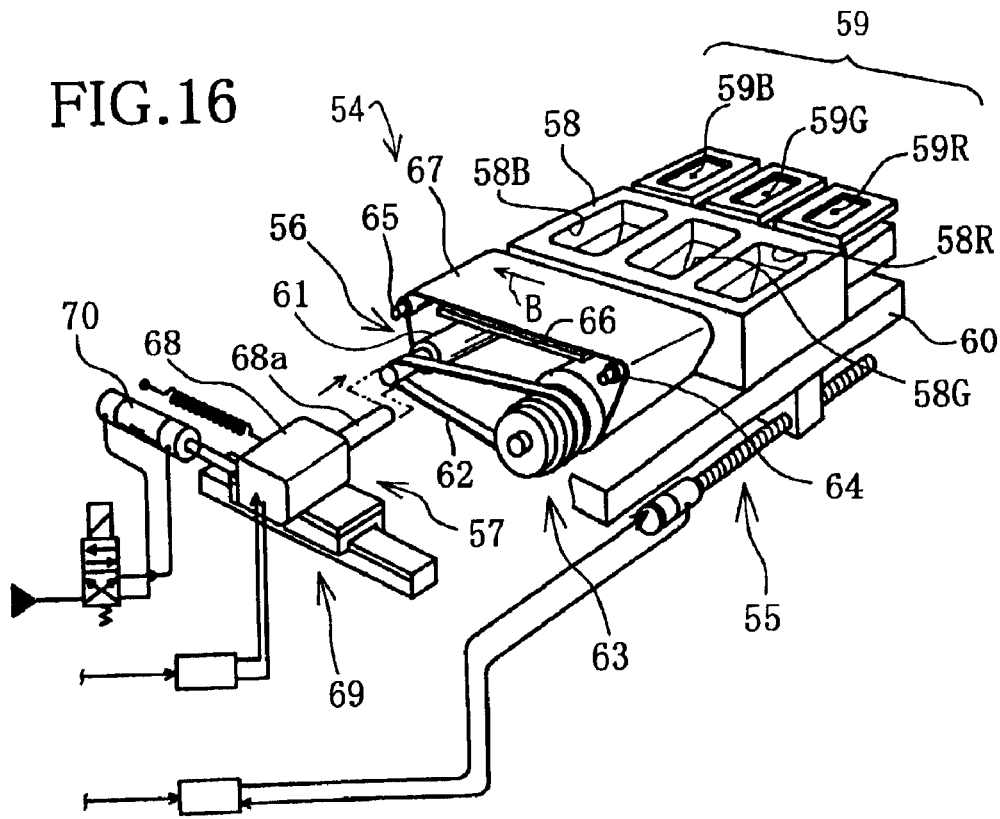
FIG. 16 is a perspective view of a head maintenance mechanism.

As shown in FIGS. 2, 3 and 16, the absorbing sheet winding mechanism 56 includes a one-way clutch driving roller 61, a back tensioning mechanism 63, following rollers 64, 65, and a support plate 66. A driving force from the sheet winder driving mechanism 57 can be transmitted to the driving roller 61. The back tensioning mechanism 63 includes a belt 62 provided between the driving roller 61 and the back tensioning mechanism 63 and applies constant tension in a direction reverse to a sheet winding direction. An absorbing sheet 67 is set to the driving roller 61 and the following rollers 64, 65 of the back tensioning mechanism 63 so as to be wound by the driving roller 61, via the driving roller 61 and the following rollers 64, 65, by the sheet winder driving mechanism 57. The absorbing sheet 67 removes liquids and contaminants adhered to a nozzle surface by rubbing the nozzle surface in order to clean the nozzle surface.

The sheet winder driving mechanism 57 includes a servomotor 68, an X-direction motor moving mechanism 69, and an air cylinder 70. The servomotor 68 has an output shaft 68a, to which a rubber having a high friction coefficient is externally fixed. The X-direction motor moving mechanism 69 supports the servomotor 68 so that the servomotor 68 can slide in the X-direction. The air cylinder 70 moves the X-direction motor moving mechanism 69 to switch the position of the output shaft 68a of the servomotor 68 between a driving force transmitting position and a non-transmitting position. While the movable table 60 is moved to a standby position (absorbing sheet winding position) by the electric cylinder 55, the position of the output shaft 68a of the servomotor 68 is switched to the driving force transmitting position by the air cylinder 70 and a driving force of the servomotor 68 is transmitted to an input shaft of the driving roller 61 to wind the absorbing sheet 67 in a direction indicated with an arrow B in FIG. 16.

The purge tray 58 includes three recessed portions 58B, 58G, 58R. The nozzle heads 8B, 8G, 8R are moved above the recessed portions 58B, 58G, 58R, respectively, so that the nozzle heads 8B, 8G, 8R oppose the recessed portions 58B, 58G, 58R. Under this condition, the head cleaning solvent 11 is supplied to the nozzle heads 8B, 8G, 8R to clean the nozzles 51 by ejecting the solvent 11 from the nozzles 51. When the ejection condition check is performed, the nozzle heads 8B, 8G, 8R are moved above the recessed portions 58B, 58G, 58R, respectively, and an ejection check is performed on a head-by-head basis. Accordingly, during the ejection condition check using the ejection check mechanism 53, liquid droplets ejected from the nozzle heads 8 can be stored in the purge tray 58, without scattering the liquid droplets. The rubber pad unit 59 includes three rubber pads 59B, 59G, 59R, which are moved under the nozzle heads 8B, 8G, 8R, respectively, and cover the nozzle heads 8B, 8G, 8R to prevent the nozzles 51 from drying.

As shown in FIGS. 1 to 4 and 12, the ejection check mechanism 53 is provided near the head maintenance mechanism 54 in the maintenance room 16. The ejection check mechanism 53 include a Y-direction camera moving mechanism 71a, a Y-direction flash moving mechanism 71b, scanning position switching mechanisms 72a, 72b, a CCD camera 73, and a flashing device 74. The Y-direction camera moving mechanism 71a and the scanning position switching mechanism 72a are disposed on the left side of the opening portion 14a of the partition 14, and the Y-direction flash moving mechanism 71b and the scanning position switching mechanism 72b are disposed on the right side of the opening 14a, so as to face each other. The CCD camera 73 is provided to scan an ejection condition of liquid droplets. The flashing device 74 floods the CCD camera 73 with light.

The CCD camera 73 is disposed on the left side of the opening portion 14a of the partition wall 14. The Y-direction camera moving mechanism 71a, for moving the CCD camera 73 in the sub-scanning direction, and the scanning position switching mechanism 72a including air cylinders 75, 76 (FIG. 1) are also provided on the left side. The air cylinder 76 is disposed under the air cylinder 75, so that the CCD camera 73 can be moved in the main scanning direction to be positioned at two positions in addition to a base position. The flashing device 74 is disposed on the right side of the opening portion 14a. The Y-direction flash moving mechanism 71b, for moving the flashing device 74 in the sub-scanning direction, and the scanning position switching mechanism 72b, having a similar structure to the scanning position switching mechanism 72a, are also provided on the right side.

The ejection condition check of the nozzle heads 8B, 8G, 8R is performed on a head-by-head basis. Each of the nozzle heads 8B, 8G, 8R has the sixty-four nozzles 51 aligned in a row in the sub-scanning direction. In this embodiment, in each of the nozzle heads 8B, 8G, 8R, sixteen nozzles 51 are regarded as a group, for example, a group of the nozzle no. 1 to the nozzle no. 16, a group of the nozzle no. 17 to the nozzle no. 32, and so on. The ejection condition check is performed with respect to the groups of the nozzles 51. When the ejection condition check is performed, first, the CCD camera 73 and the flashing device 74 are set at their initial positions in the sub-scanning direction. Then, ejection conditions of nozzle no. 1 to nozzle no. 16 in a first group are checked. Next, the CCD camera 73 and the flashing device 74 are moved forward and ejection conditions of nozzle no. 17 to nozzle no. 32 in a second group are checked. After that, the nozzles 51 in third and fourth groups are checked in a similar manner.

The Y-direction camera moving mechanism 71a and the Y-direction flash moving mechanism 71b move the CCD camera 73 and the flashing device 74, respectively, in the sub-scanning direction (Y-direction) by a distance of sixteen nozzles. In order to perform the ejection condition check of the nozzles 51 of the nozzle heads 8R, 8G, 8B under certain conditions, a distance between the CCD camera 73 and the flashing device 74 is maintained constant at all times and liquid droplets are scanned at midpoint between the CCD camera 73 and the flashing device 74. Therefore, the CCD camera 73 and the flashing device 74 can be located at three positions in the X-direction, with respect to the nozzle head 8 subject to the ejection condition check. When the ejection condition of the nozzle head 8R is checked, the air cylinders 75, 76 of the left scanning position switching mechanism 72a are projected to their maximum and the air cylinders 75, 76 of the right scanning position switching mechanism 72b are retracted to their maximum.

When the ejection condition of the nozzle head 8G is checked, one of the air cylinders 75, 76 of the left scanning position switching mechanism 72a is retracted and one of the air cylinders 75, 76 of the right scanning position switching mechanism 72b is projected. When the ejection condition of the nozzle head 8B is checked, both the air cylinders 75, 76 of the left scanning position switching mechanism 72a are retracted to their maximum, and both the air cylinders 75, 76 of the right scanning position switching mechanism 72b are projected to their maximum. As described above, liquid droplets can be scanned while the distance between the CCD camera 73 and the flashing device 74 are maintained constant at all times with respect to the nozzle head 8 subject to the ejection condition check. Thus, the reliability of the ejection condition check can be increased.

The automatic alignment mechanism 36 for positioning the glass substrate 4 at the home position will be described. The automatic alignment mechanism 36 includes devices provided in the checking/adjusting stage 44, as well as the X-direction substrate moving mechanism 20, the Y-direction substrate moving mechanism 19 and the rotating device 35 provided in the patterning room 15.

As shown in FIGS. 1 to 4 and 15, the large and small alignment marks AM1 to AM4 are provided on right and left corners of a trailing edge of the glass substrate 4. The alignment marks AM1 to AM4 are scanned and then the scanned image data is analyzed by the control device 13 to obtain an amount of deviation of the glass substrate 4 from the home position. Based on the obtained amount of the deviation, the glass substrate 4 is set to the home position.

The CCD camera 32a of low power and the CCD camera 32c of high power are provided to a support plate 77 to scan the left alignment marks AM1, AM3, respectively, on the left of the opening portion 14a of the glass substrate 4 at the checking/adjusting stage 44. The CCD cameras 32a, 32c scan the alignment marks AM1, AM3, through a glass window provided to the partition 14. The position of the CCD cameras 32a, 32c can be changed by an air cylinder 78 and can focus manually in accordance with a thickness of the glass substrate 4.

Likewise, the CCD camera 32b of low power and the CCD camera 32d of high power are provided to a support plate 79 to scan the right alignment marks AM2, AM4, respectively, on the right of the opening portion 14a on the checking/adjusting stage 44. The CCD cameras 32b, 32d scan the alignment marks AM2, AM4, through the glass window provided to the partition 14. The position of the CCD cameras 32b, 32d can be changed by an air cylinder 80 and can focus manually in accordance with a thickness of the glass substrate 4. Further, an X-direction camera moving mechanism 81 and a Y-direction camera moving mechanism 82 are provided to precisely move the CCD cameras 32b, 32d on the support plate 70 in the X- and Y-directions independently in order to detect the right alignment marks AM2, AM4, the positions of which are likely to change in the front and rear direction or in the right and left direction when the glass substrate 4 conveyed to the home position deviates greatly from the proper position or a size of the glass substrate 4 is changed.

When the glass substrate 4, placed on the substrate holder 21, is aligned at the initial set position (home position), the large alignment marks AM1, AM2 are scanned by the right and left low-powered cameras 32a, 32b and then the scanned image data is sent to the control device 13. The control device 13 analyzes the image data using a predetermined control program to obtain an amount of deviation of the glass substrate 4 from the home position in the X-direction, $\Delta X$, an amount of deviation of the glass substrate 4 from the home position in the Y-direction, $\Delta Y$, and an amount of deviation of a rotation angle about the pin 22 $\Delta \alpha$. Based on the obtained amounts of the deviations $\Delta X$, $\Delta Y$, $\Delta \alpha$, the glass substrate 4 is roughly positioned at the home position by the X- and Y-direction substrate moving mechanisms 20, 19 and the rotating device 35.

Then, the small alignment marks AM3, AM4 are scanned by the right and left high-powered cameras 32c, 32d and the scanned image data is sent to the control device 13. The control device 13 analyzes the image data using the predetermined control program to obtain an amount of deviation of the glass substrate 4 from the home position in the X-direction, $\Delta X$, an amount of deviation of the glass substrate 4 from the home position in the Y-direction, $\Delta Y$, and an amount of deviation of a rotation angle about the pin 22, $\Delta \alpha$. Based on the obtained amounts of the deviations $\Delta X$, $\Delta Y$, $\Delta \alpha$, the glass substrate 4 is precisely positioned at the home position by the X- and Y-direction substrate moving mechanisms 20, 19 and the rotating device 35. Accordingly, even when the thickness or the size of the glass substrate 4 vary, the glass substrate 4 can be precisely and surely positioned at the home position.

The ejection condition check performed by the ejection check mechanism 53 will be described. As described above, the ejection condition check of the nozzles 51 are performed by group of nozzles in the nozzle head 8. Further, the ejection condition check can be performed by lifting the nozzle head holding device 7 to the checking/adjusting stage 44 while the nozzle head holding device 7 is attached to the movable member 40 of the Z-direction head holder moving mechanism 6. Therefore, the ejection condition check by the ejection check mechanism 53 can be performed during conveying of the glass substrate 4 in patterning process for forming a pattern on the glass substrate 4 and automatic alignment. Accordingly, the possibility of the occurrence of defectives can be reduced, so that an availability rate of the liquid droplet patterning device 1 can be increased.

A method for checking whether an ejection condition of the nozzles 51 is normal will be described. As shown in FIGS. 3, 12 to 14, sixteen observation windows 83, corresponding to the sixteen nozzles 51 of a group, are provided in a scanning area PA (approximately 6.5 mm by 5 mm) of the CCD camera 73, in the sub-scanning direction, at regular intervals. The observation windows 83 are provided at positions downwardly shifted by approximately 1.5 mm away from the lower ends of the nozzles 51 and each of the observation windows 83 is derived from a 60- by 10-pixel matrix.

A liquid droplet is ejected from the sixteen nozzles 51, for example, at a speed of approximately 7 meters per second, and scanned within an area of the observation window 83. At that time, the CCD camera 73 scans at approximately $\frac{1}{10000}$th second, for example, and a flashing period is approximately 1 $\mu$sec. The scanned image data is sent to the control device 13 in signals to process the image using a predetermined image processing program. In this processing, for example, when most of an image of a liquid droplet ejected from the nozzle head 8 is within the observation window 83 (the nozzle nos. 1 to 7, 9, 10, 12 to 16 in FIG. 13), it is determined that the ejection condition of the nozzle 51 is normal. When the image of the liquid droplet is out of the observation window 83 (nozzle nos. 8 and 11), it is determined that the ejection condition of the nozzle 51 is abnormal. The abnormal ejection is caused by, for example, an abnormality of the ejecting speed, nonejection, or accumulation of contaminants on the nozzle surface (mostly, solidification of EL polymer).

The control for recording a dot pattern on the glass substrate 4, using the red, green and blue liquids in various recording resolutions (ejection resolutions), by the liquid droplet patterning apparatus 1 is executed by a host control unit 107 provided in the control device 13.

Figure 17:
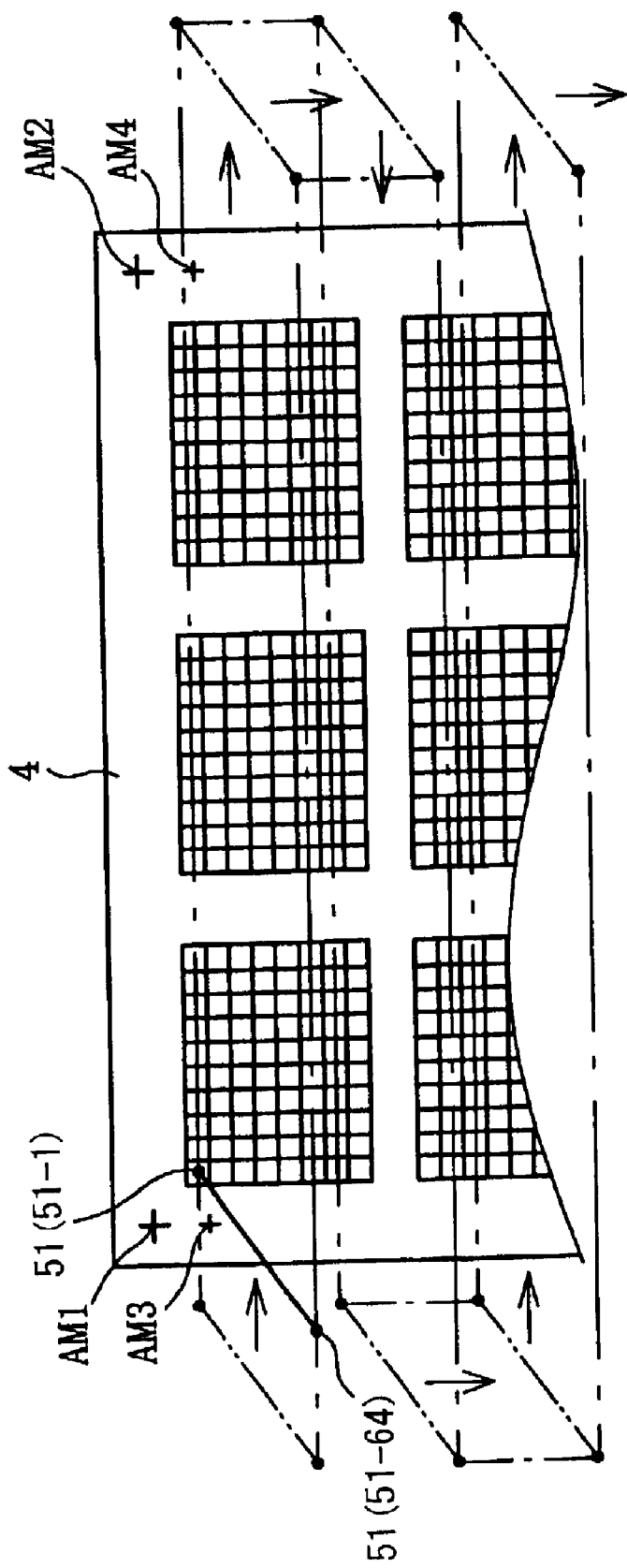
FIG. 17 is an explanatory diagram for ejecting liquid droplets onto the glass substrate.
Figure 18:
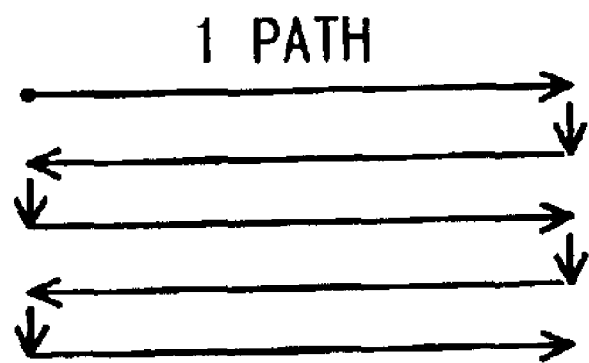
FIG. 18 is an explanatory diagram showing a movement of the nozzle heads relative to the glass substrate in an interlace recording method.
Figure 19:
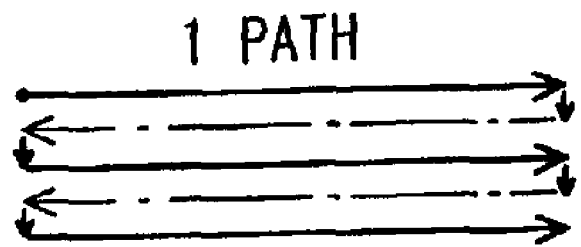
FIG. 19 is an explanatory diagram showing a movement of the nozzle heads relative to the glass substrate in the interlace recording method.

It is assumed that a nozzle pitch in the sub-scanning direction of the nozzles 51 aligned in a line of each of the nozzle heads 8 is 75 dots per inch (dpi), the nozzle pitch P is P=(25.4/75) mm. When the three head holders 50 are rotated by an angle θ with respect to the sub-scanning direction by the rotation servomotors 49 at the same time as shown in FIG. 17, the nozzle pitch Pθ in the sub-scanning direction is P×cos θ. Therefore, by changing the angle θ within a range of between 0 and 60 degrees, the nozzle pitch can be seamlessly narrowed within a range of between P×(1.0) to P×(0.5).

a) When it is desired to obtain a resolution of between 75 and 150 dpi (see FIG. 18):

A rotation angle θ of the nozzle heads 8 is set to an appropriate angle within the range of between 0 and 60 degrees that provides a desired resolution. One path of recording operation is performed in the main scanning direction and then the glass substrate 4 is moved backward (in a direction reverse to the sub-scanning direction) by 64×P×cos θ and retained at the position. For example, when it is desired to obtain a resolution of 75 dpi, the rotation angle θ is set to 0 degree, and when it is desired to obtain a resolution of 150 dpi, the rotation angle θ is set to 60 degrees.

b) When it is desired to obtain a resolution of between 150 and 300 dpi (see FIG. 19):

For example, recording in a resolution of 150 dpi is achieved by which, first, a recording operation is performed in the resolution of 75 dpi, and then the head holders 50 are shifted by a half pitch as shown by a dot and dashed line and recording operation is performed over the pattern formed in the resolution of 75 dpi. Therefore, a rotation angle θ of the nozzle heads 8 is set to an appropriate angle within the range of between 0 and 60 degrees that provides a half of a desired resolution in the sub-scanning direction, in a manner similar to that described above. Then, one path of recording operation is performed in the main scanning direction, and then the glass substrate 4 is moved backward by 0.5×P×cos θ. At the position, one path of recording operation is performed, and then the glass substrate 4 is moved backward by 63.5×P×cos θ and retained at the position. For example, when it is desired to obtain a resolution of 150 dpi, the rotation angle θ is set to 0 degree, and when it is desired to obtain a resolution of 300 dip, the rotation angle θ is set to 60 degrees.

c) When it is desired to obtain a resolution of between 37.5 and 75 dpi:

A rotation angle θ of the nozzle heads 8 is set to an appropriate angle within the range of between 0 and 60 degrees that provides double a desired resolution. One path of recording operation is performed in the main scanning direction using, for example, the odd numbered nozzles 51 (the nozzle nos. 1, 3, 5 . . . ). Then, the glass substrate 4 is moved backward by 64×P×cos θ and retained at the position. For example, when it is desired to obtain a resolution of 37.5 dpi, the rotation angle θ is set to 0 degree, and when it is desired to obtain a resolution of 75 dpi, the rotation angle θ is set to 60 degrees.

Only a few examples of the setting of the resolution are described above. A resolution of between 225 and 450 dpi or between 300 and 600 dpi can be achieved by performing the recording operation in small pitch. As described above, in order to obtain a desired resolution, the rotation angle θ of the nozzle heads 8 are controlled within the range of between 0 and 60 by the rotation servomotors 49 at the same time.

A control for correcting the nozzle pitch error caused by variations in production using the rotation angle θ will be described. This control is executed by the host control unit 107 in the control device 13.

Assuming that a nozzle pitch between adjacent nozzles (design value) is P0 and the number of nozzles is n, an internozzle dimension L0, which is a distance between the headmost nozzle and the rearmost nozzle (design value), is expressed by the following equation:

$$L0 = P0 \times (n-1). \quad (1)$$

Assuming that a distance between the headmost nozzle and the rearmost nozzle (measured value) is L, an amount of error, $\Delta L$, of the measured value L from the design value L0 is $\Delta L = (L - L0)$. The internozzle dimension L of all the nozzle heads 8 is measured to obtain the amount of the error $\Delta L$. The obtained errors $\Delta L$ are classified into the five grades of internozzle dimension error described above.

Given that a desired resolution in the sub-scanning direction is R, a rotation angle is θ, and an actual nozzle pitch is P1, the actual nozzle pitch P1 is expressed by the following equation:

$$P1 = L/(n-1) = (\Delta L + L0)/(n-1)$$
$$= [\Delta L + P0 \times (n-1)]/(n-1)$$
$$= \Delta L/(n-1) + P0.$$

When the rotation angle is θ, the nozzle pitch in the sub-scanning direction is P1×cos θ. Therefore, $$P1 \times \cos\theta = 25.4/R = [\Delta L/(n-1) + P0] \times \cos\theta, \text{ and}$$

$$\theta = \cos^{-1}(25.4/R)/[\Delta L/(n-1) + P0].$$

That is, the rotation angle θ can be calculated by using the resolution R in theory. In reality, however, the nozzle heads 8 are rotated extra by an angle $\Delta\theta$ because of the existence of the nozzle pitch error. An actual rotation angle θ is calculated by specifying a desired resolution and the nozzle pitch error before the nozzle heads 8 are rotated.

When the internozzle dimension errors of all the nozzle heads 8 are the same, the value of the internozzle dimension error can be specified directly. Generally, there are few cases at which the internozzle dimension errors of all the nozzle heads 8 are the same. Therefore, the internozzle dimension errors are classified into a plurality of grades (for example, five grades) to maintain the nozzle heads 8 easily. A center value error is obtained by grade from an upper limit value and a lower limit value of the internozzle dimension error of each grade. By doing so, nozzle heads 8 can be selected from the same error grade of a plurality of the nozzle heads 8 in the various grades. Further, an appropriately precise correction can be performed using an actual rotation angle θ, which is obtained from a desired resolution and a center value error of the nozzle heads 8 in the same error grade.

A rotation angle θ is obtained using the above-described equation, and the nozzle heads 8 are rotated by the rotation angle θ within a range that satisfies $0 \leq \theta \leq 60°$, that is, $0.5 \leq \cos \theta \leq 1$. By doing so, the nozzle pitch error can be corrected. When $P1 \times \cos \theta = 25.4/R = P0$, the rotation angle θ is 0 degree in a normal situation. However, when the internozzle dimension L is small, $P1 \leq P0$ and thus $\cos \theta \geq 1$ and, therefore, it does not satisfy $P1 \times \cos \theta = 25.4/R = P0$. When $25.4/R = P0/2$, the rotation angle θ is 60 degree in the normal situation. However, when the internozzle dimension L is large, $P0 \leq P1$, and thus $\cos \theta \leq 0.5$, it does not satisfy $25.4/R = P0/2 = P1 \times \cos \theta$. That is, in this case, the rotation angle θ is set to nearly 0 degree and one path of recording operation and interlaced recording are performed.

The liquid supply device 12 will be described below. As shown in FIGS. 1, 2 and 10, the liquid supply device 12 is provided to a side of the casing 3 of the liquid droplet patterning apparatus 1 to supply red, green and blue colored liquid 10 and the cleaning (flushing) solvent 11 to the head holders 50R, 50G, 50B.

Liquid containers 84, including liquid containers 84R, 84G, 84B, contain the respective colored liquid 10. The liquid containers 84 are designed such that the liquid containers 84 can be raised and lowered in synchronization with ascent and descent movements of the Z-direction head holder moving mechanism 6. The liquid supply device 12 also includes an waste liquid reservoir 85, a solvent container 86 for the cleaning solvent 11, and a valve unit 87. The red, green and blue liquids 10 contained in the liquid containers 84R, 84G, 84B are supplied to the nozzle heads 8R, 8G, 8B via the valve unit 87, and are ejected from the nozzles 51 in the nozzle heads 8R, 8G, 8B, respectively.

When the nozzle heads 8 are cleaned, the cleaning solvent 11 in the solvent container 86 is also supplied to the nozzle heads 8R, 8G, 8B via the valve unit 87 and is ejected/sucked from the nozzles 51. The recessed portions 58B, 58G, 58R in the purge tray 58 of the head maintenance mechanism 54 are connected with a tube. Waste liquid is sucked using a negative pressure through the tube, and the sucked waste liquid is stored in the waste liquid reservoir 85. A tube 88, extending from waste liquid reservoir 85, is connected with a mist separation tank (not shown). Tubes 89, 90, 91, extending from the liquid containers 84R, 84G, 84B, respectively, and a tube 92, extending from the solvent container 86, are connected with a compressed nitrogen gas line (not shown). The negative pressure is generated by a vacuum pump or an ejector and exhaust is discharged to an organic air duct provided in a plant.

A support frame 93 of the liquid supply mechanism 12 is provided with a holder 94 that can be moved up and down by a liquid container ascending/descending mechanism 95. The liquid container ascending/descending mechanism 95 has an electric cylinder with a metal bellows 96. A tip of a rod of the electric cylinder 96 is connected to the holder 94. The electric cylinder 96 is moved up and down in synchronization with the up and down movements of the Z-direction head holder moving mechanism 6 to move holding members 97 (97R, 97G, 97B) so that liquid levels in the liquid containers 84R, 84G, 84B are maintained at a predetermined position with respect to the levels of the nozzle heads 8R, 8G, 8B. Three liquid level retaining mechanisms 98 are provided that maintain the liquid levels in the liquid containers 84R, 84G, 84B at a stable or constant position in accordance with consumption of the liquids 10 in the liquid containers 84R, 84G, 84B. A locking mechanism 99 is provided to each of the liquid level retaining mechanisms 98.

Each of the liquid levels in the liquid containers 84R, 84G, 84B is corrected at all times to the fiducial position (e.g. 50 mm) that is lower than a position where the nozzles 51 are located. Each liquid level retaining mechanism 98 includes a cylindrical casing 100 extending in the vertical direction, a shaft member 101, a coil compression spring 102 as an elastic member, a sleeve 103, and the holding member 97R, 97G, 97B for holding the liquid containers 84R, 84G, 84B. A flange 100a provided to an upper end of each of the casings 100 is detachably attached to the holder 94. The shaft member 101 is provided in each casing 100 so as to be integrally fixed to the casing 100.

Upper ends of the shaft members 101 are connected to the holding members 97 in the casings 100. In each liquid level retaining mechanism 98, the sleeve 103, constituted by a ball spline, is driven into the casing 100. The coil compression spring 102 is provided in a space surrounded by the casing 100, the shaft member 101, and the sleeve 103. The liquid containers 84 containing the liquid 10 are resiliently supported by the holding members 97, and the liquid levels in the liquid containers 84 are maintained at the certain position. As the liquid levels lower in accordance with the consumption of the liquids 10, the holding members 97 are pushed upward by the coil compression springs 102 by an amount of the consumption of the liquids 10 to retain the liquid level at the certain level.

Each of the locking mechanisms 99 restrains vibrations caused by the coil compression spring 102 when the holder 94 is moved up and down by the electric cylinder 96, and includes a small air cylinder 104 and a pad 105 fixed to a tip of a rod of the air cylinder 104. The air cylinder 104 is fixed to a side of an upper half of the casing 100 in a horizontal position while the tip of the rod is inserted into the casing 100. The sleeve 103 is urged by the pad 105 to restrain the vibrations. The liquid containers 84R, 84G, 84B, the waste liquid reservoir 85, and the solvent container 86 for the nozzle head cleaning solvent 11 are contained in a glove box 106 and can be replaced with new ones via a hatch (not shown).

Figure 21:
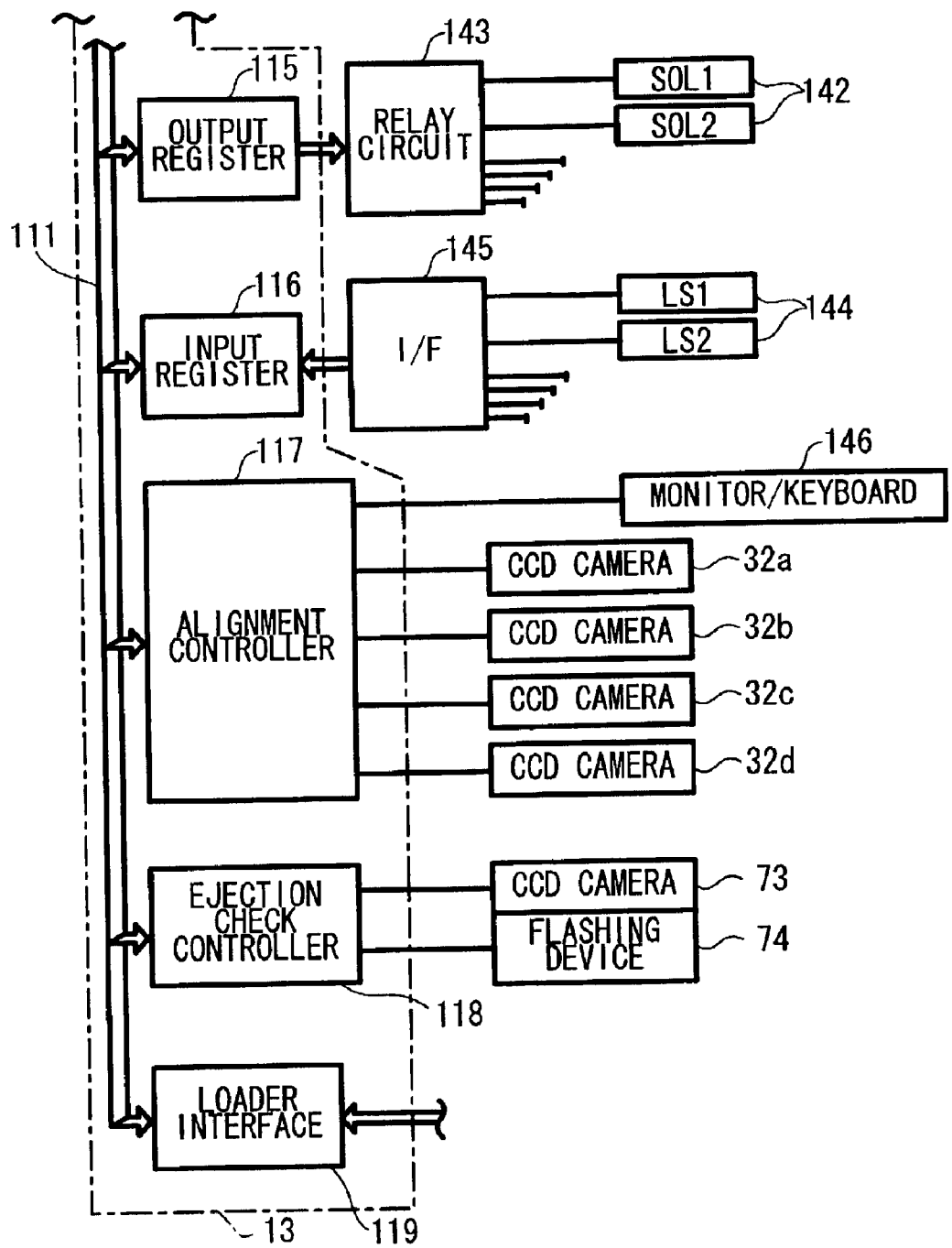
FIG. 21 is a block diagram of the control system of the liquid droplet patterning apparatus.

A control system, including the control device 13 of the liquid droplet patterning apparatus 1, will be described. As shown in FIGS. 20 and 21, the host control unit 107 of the control device 13 has a computer including a CPU, a ROM and a RAM, and stores various control programs for controlling the cameras and monitors provided in the liquid droplet patterning apparatus 1. The host control unit 107 is connected with an operating panel 108, an external storage device 109 and a power supply circuit 110. The external storage device 109 stores image data of dot patterns to be formed on the glass substrate 4, a system constant of the liquid droplet patterning apparatus 1, and production management information. The external storage device could also be part of the control device 13.

The host control unit 107 is connected with a digital signal processor (DSP) 12, moving pulse generating circuits 113, 114, an output register 115, an input register 116, an alignment controller 117, an ejection check controller 118, and a loader interface (I/F) 119 via an input/output line 111. The DSP 112 is connected with the nozzle heads 8R, 8G, 8B via a signal output circuit 120 and a drive circuit 121. The DSP 112 has a CPU, a ROM and a RAM. The ROM of the DSP 112 stores a recording operation control program to be used for driving the nozzle heads 8 to perform the recording operation.

The drive circuit 121 has a pulse generating circuit (not shown) that generates a drive pulse for driving a plurality of piezoelectric elements that actuate the plurality of the nozzles 51. A waveform of the drive pulse may be set for common use in the nozzle heads 8R, 8G, 8B or may be separately set with respect to the nozzle heads 8R, 8G, 8B. In order to display the waveform of the drive pulse, a waveform monitor 122 is connected with the drive circuit 121. The waveform of the drive pulse can be individually set on a nozzle-by-nozzle basis. By doing so, an amount of ejection of liquid droplets and the time between applying the drive pulse and ejecting ink droplets can be the same in all of the nozzles 51. Thus, the ejection can be precisely controlled.

The DSP 112 is also connected with the moving pulse generating circuit 113. A detection signal outputted from an X-axis linear scale 123, which precisely detects an amount of travel of the X-direction substrate moving mechanism 20 driven by the X-axis servomotor 28 to perform the recording operation in accordance with the movement of the glass substrate 4 in the X-direction, is sent to the DSP 112 via an amplifier (AMP) 123a.

A data storage device 124, which stores recording data and phase data (data for setting an ejection timing), is connected to the DSP 112. The data storage device 124 stores data sent from the host control unit 107 and outputs the data to the DSP 112 for the recording operation.

The moving pulse generating circuit 113 is connected with drivers 125 to 131. The driver 125 drives the X-direction servomotor 28 for the X-direction substrate moving mechanism 20 that moves the glass substrate 4 in the X-direction. The driver 126 drives the Y-direction servomotor 31 for the Y-direction substrate moving mechanism 19. The driver 127 drives the rotation servomotors 49 and the driver 128 actuates the position adjusting mechanisms 48 that adjust the head holders 50R, 50G, 50B in the sub-scanning direction. The driver 129 drives a Z-direction servomotor 129a that drives the electric cylinder 41 to move the nozzle head holding device 7 up and down and the driver 131 drives a Z1-direction servomotor 130 that drives the electric cylinder 96 for moving the holder 94 of the liquid supply mechanism 12. An encoder 150, which detects rotations of the rotation servomotors 49, is connected to the driver 127 via an amplifier 150a.

The driver 125 controls the X-direction servomotor 28 based on detection signals outputted from the X-direction encoder 27, built-in to the X-direction servomotor 28, and the X-direction linear scale 123. Similarly, a Y-direction linear scale 132 is provided that precisely detects an amount of travel in the Y-direction of the Y-direction substrate moving mechanism 19. The driver 126 controls the Y-direction servomotor 28 based on detection signals outputted from the encoder 30, built-in to the Y-direction servomotor 31, and the Y-direction linear scale 132. Therefore, a position of the glass substrate 4 in the X- and Y-directions can be precisely controlled by individually and precisely moving the glass substrate 4 in the X- and Y-directions by the X-direction substrate moving mechanism 20 and the Y-direction substrate moving mechanism 19.

The moving pulse generating circuit 114 is connected with drivers 134, 136, 138, 140, 141. The driver 134 drives an adjustment servomotor 133 for adjusting the glass substrate 4 to the home position using the alignment marks AM1 to AM4. The driver 136 drives a movement servomotor 135 for moving the CCD camera 73 to be used for the ejection condition check and the driver 138 drives a movement servomotor 137 for moving the flashing device 74 for the ejection condition check. The driver 140 drives a movement servomotor 139 for moving the head maintenance mechanism 54 and the driver 141 drives the winder servomotor 68 for winding the absorbing sheet 67.

As shown in FIGS. 20 and 21, the input/output line 11 connected to the host control unit 107 is connected with the output register 115, the input register 116, the alignment controller 117, the ejection check controller 118, and the loader interface 119. The output register 115 is connected with a relay circuit 143 that drives a plurality of solenoid valves (SOL1, SOL2) 142 of the valve unit 87 in the liquid supply mechanism 87. The input register 116 is connected with an interface (I/F) 145 connected with a plurality of detection switches (LS1, LS2) 144. The alignment controller 117 is connected with a monitor and keyboard 146 and the four CCD cameras 32a to 32d used for adjusting the glass substrate 4 using the alignment marks AM1 to AM4. The ejection check controller 118 drives the CCD camera 73 and the flashing device 74 for the ejection condition check. The loader interface 119 sends/receives signals to/from the loader H for conveying the glass substrate 4.

Figure 22:
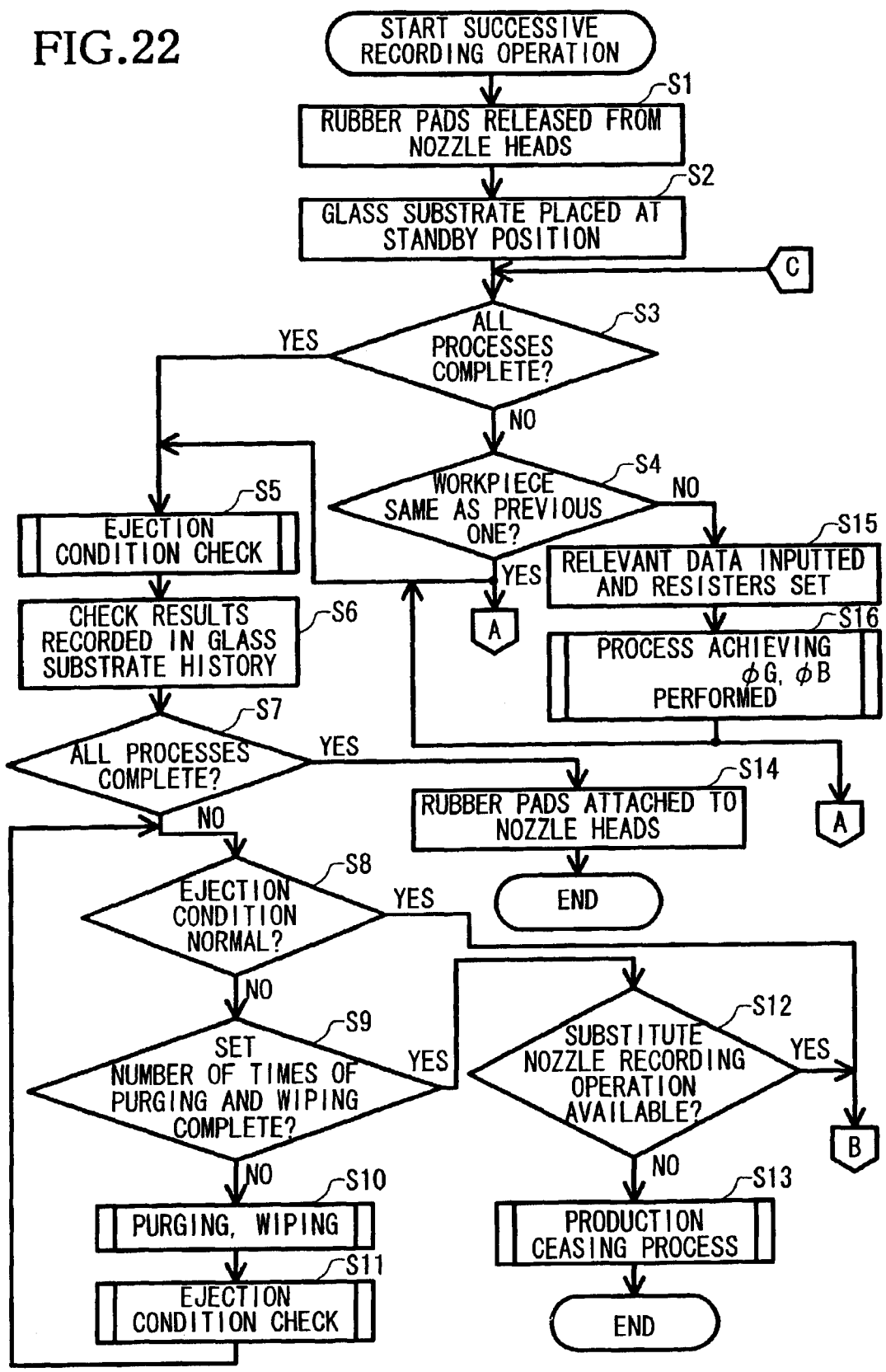
FIGS. 22 and 23 are control flowcharts of successive recording operations.
Figure 23:
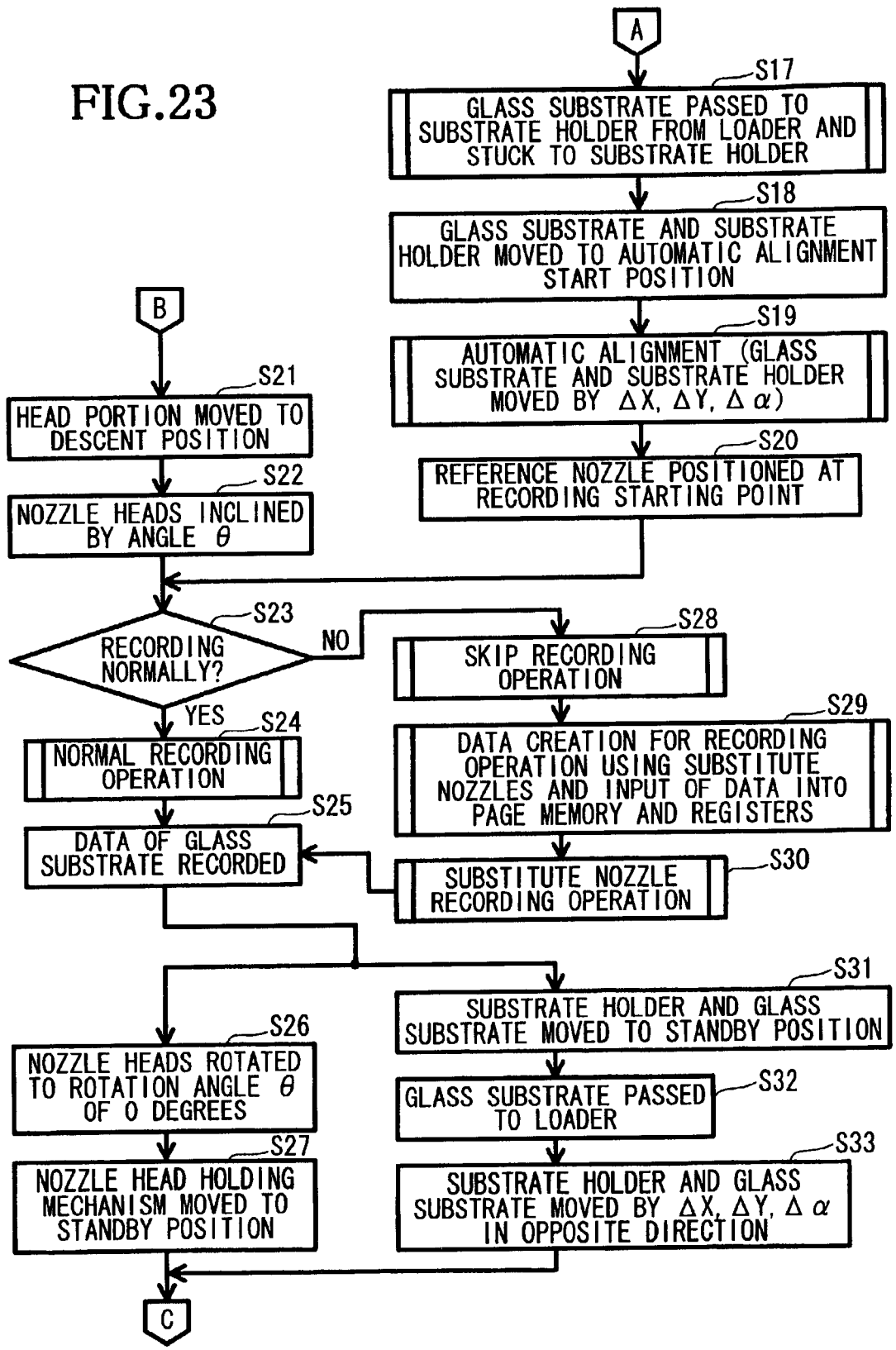

Next, a control for a successive recording operation will be described. In the successive recording operation, a dot pattern is recorded on a workpiece (glass substrate 4) one after another by replacing the workpiece with a next workpiece to be processed after each recording operation is complete. As shown in FIGS. 22 and 23, when the main power of the liquid droplet patterning apparatus 1 is turned on and a switch is manually operated, the control of the successive recording operation is started. First, the nozzle heads 8 are released from the rubber pads (caps) 59B, 59G, 59R of the maintenance mechanism 54 (S1, hereinafter, S stands for a step). Then, a standby position in the Z-direction of the nozzle head holding device 7 and a standby position about the X-, Y- directions and an α-direction, that is the rotation about the pin (rotational axis) 22 of the substrate holder 21, are confirmed, and then the substrate holder 21 is moved to the standby position 21b shown in FIG. 2 and the nozzle head holding device 7 is moved to the standby position HP shown in FIG. 6 (S2).

Figure 24:
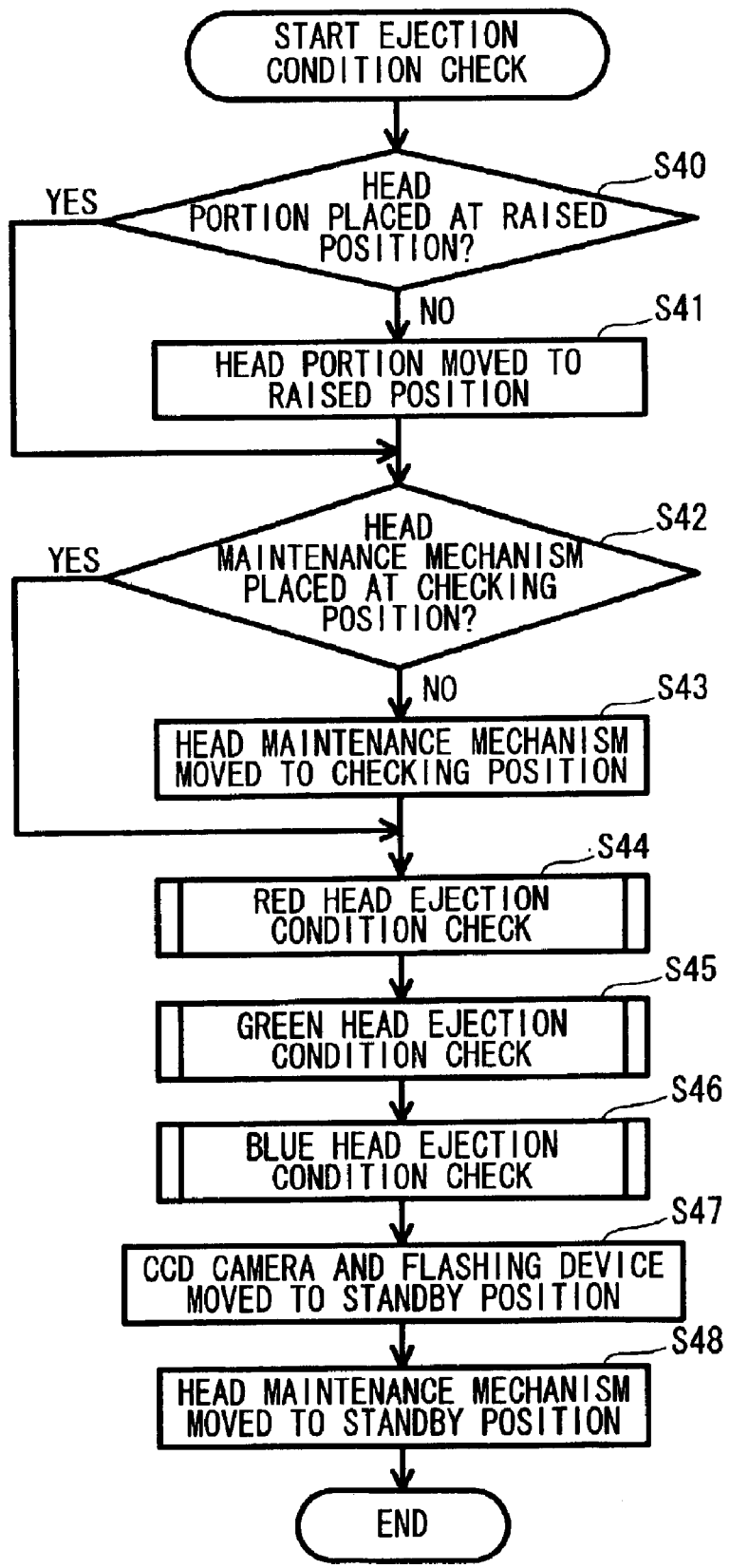
FIG. 24 is a control flowchart of the ejection condition check.
Figure 25:
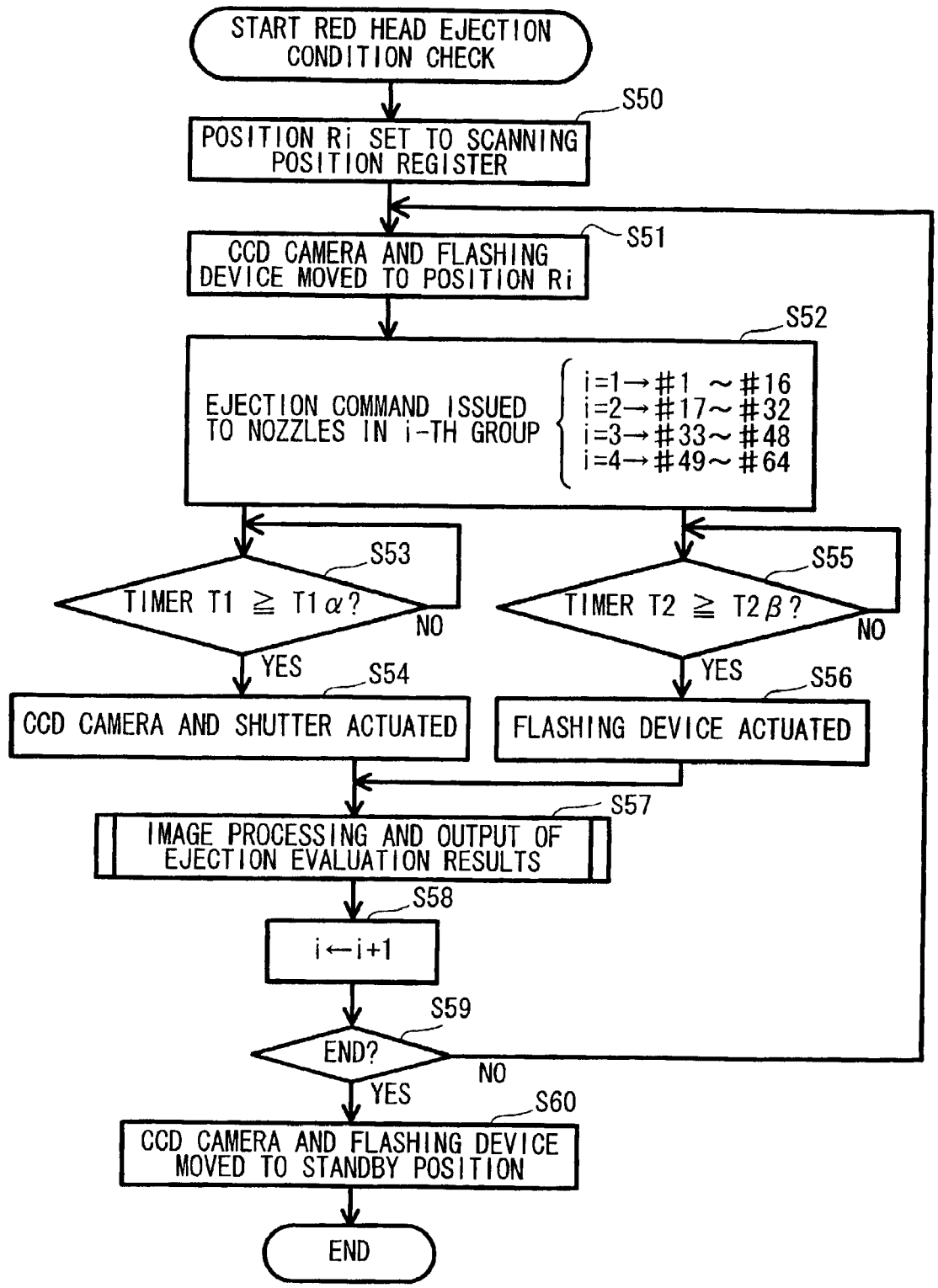
FIG. 25 is a control flowchart of the ejection condition check with respect to a red nozzle head.

It is determined whether all processes (recording operations) with respect to the glass substrate 4 are complete (S3). When all the processes are complete (S3:Yes), flow goes to S5. At S5, the ejection condition check is performed using the ejection check mechanism 53 and the head maintenance mechanism 54, as shown in FIGS. 24 and 25. Then, check results are recorded in a glass substrate history (S6) and flow moves to S7. At S7, it is determined whether all processes with respect to the glass substrate 4 placed on the substrate holder 21 are complete (S7). When all the processes are complete (S7:Yes), the nozzle heads 8R, 8G, 8B are contacted with the rubber pads 59R, 59G, 59B (S14), and the control is finished.

At S3, when all the processes are not complete (S3:No), it is determined whether a workpiece (glass substrate 4) on the substrate holder 21 is the same as a previous one (whether the size of the glass substrate 4 or a dot pattern to be used for the recording operation is the same as that for previous one) (S4). When it is determined that the workpiece is the same one (S4:Yes), the process of S5 and steps subsequent to S5 and the process at S17 and steps subsequent to S17 are performed in parallel. At S5 and the subsequent steps, it is determined whether an ejection condition of the nozzles 51 is normal (S8). When the ejection condition is normal (S8:Yes), flow moves to S21 shown in FIG. 23. When the ejection condition is not normal (S8:No), flow moves to S9. At S9, it is determined whether a set number of times of a purging and wiping operation is complete. If not (S9:No), the purging operation, which ejects the cleaning solvent 11 from the nozzles 51, and the wiping operation are performed using the head maintenance mechanism 54 while the head portion 43 of the nozzle head holding device 7 is retained at the raised position by the Z-direction head holder moving mechanism 6 (S10).

After that, the above-described ejection check is performed (S11) and then flow returns to S8. When the ejection condition of the nozzles 51 is normal (S8:Yes), flow moves to S21. When the ejection condition is not normal (S8:No), it is determined whether a set number of times of the purging and wiping operation is complete (S9). When the set number of times of the purging and wiping operation is not complete (S9:No), the processes at S10, S11 and then S8 are repeated until an affirmative judgement is made at S9. When the set number of times of purging and wiping operation is complete and an affirmative judgement is made (S9:Yes), it is determined whether the recording operation can be performed using a substitute nozzle (S12). When an affirmative judgement is made (S12:Yes), flow moves to S21 shown in FIG. 23. When the recording operation cannot be performed using the substitute nozzle (S12:No), a production ceasing process is performed (S13). Then, the control is finished. At that time, the processes of S17 to S20, which are being performed in parallel with the processes of S5 to S13, are also ceased at the point of implementation of S13, even though all of the processes of S17 to S20 have not been finished. Then, the substrate holder 21 and the glass substrate 4 are moved to the standby position 21b, shown in FIG. 2, by the X- and Y-direction substrate moving mechanisms 20, 19. After that, the substrate lifting mechanism 23 lifts the glass substrate 4 from the substrate holder 21 by a predetermined distance to pass the glass substrate 4 to loader H. Then, the control is finished.

At S21 shown in FIG. 23, the head portion 43 of the nozzle head holding device 7 is moved downward to the descent position (recording position) by the Z-direction head holder moving mechanism 6. Then, the three nozzle heads 8 are rotated at the same time by an angle θ by the respective rotation servomotors 49 based on set relevant data inputted at S15 (S22). After that, flow moves to S23.

Figure 11A:
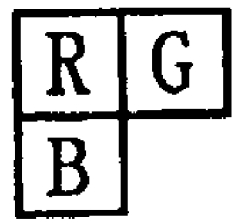
FIGS. 11A to 11C are explanatory diagrams showing ejection dot patterns of an emitter layer including red, green, blue dots.
Figure 11B:
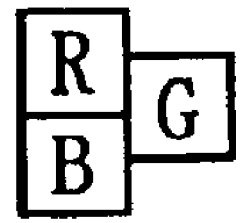
Figure 11C:
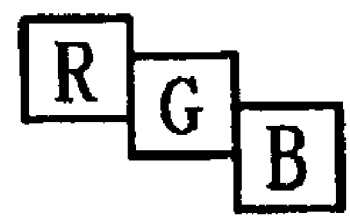
Figure 12:
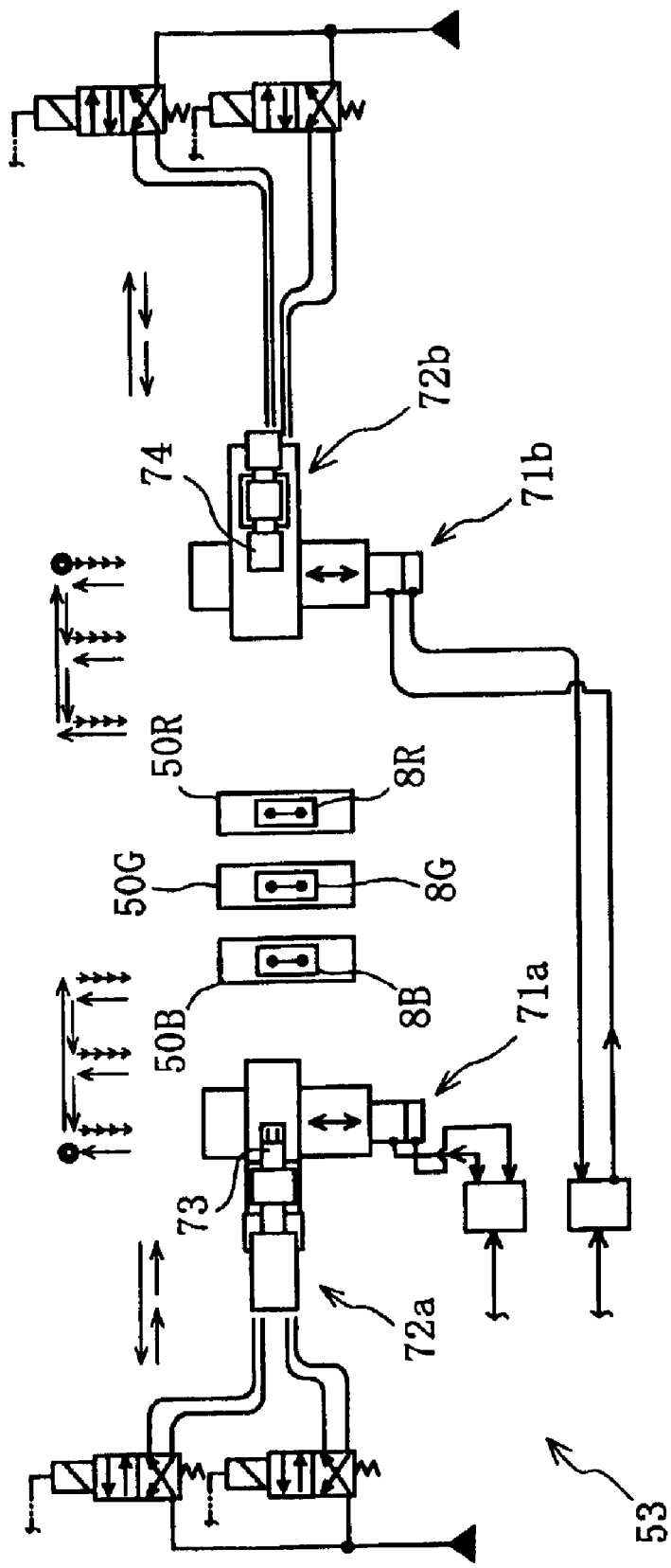
FIG. 12 is an enlarged plan view including a block diagram of a control system of an ejection check mechanism.
Figure 13:
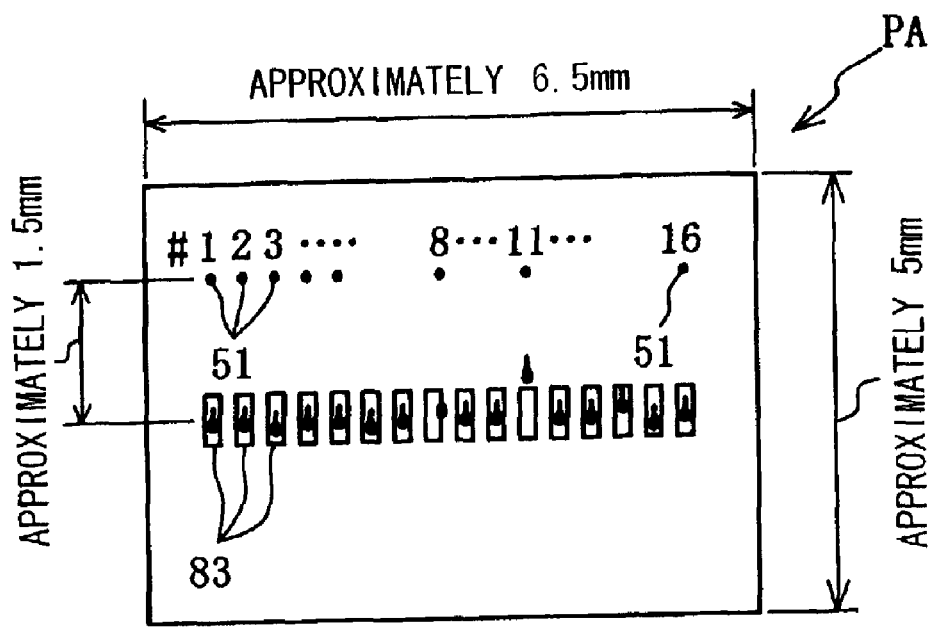
FIG. 13 is an explanatory diagram of a scanning area of a CCD camera for evaluating a nozzle ejection condition.
Figure 14:
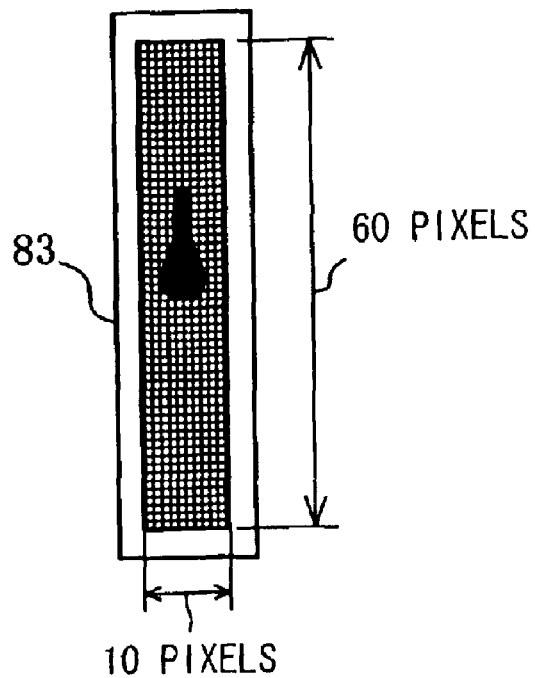
FIG. 14 is a partial enlarged view of an image of a liquid droplet scanned in an observation window.

Returning to S4, shown in FIG. 22, when the workpiece placed on the substrate holder 21 is different from the previous one (when the shape of the glass substrate 4 is different from the previous one, the size of the grass substrate 4 is different from the previous one even through its shape is the same as the previous one, or a dot pattern to be used for the glass substrate 4 to be currently processed is different from the previous one even though its shape and size are the same as those of the previous one) (S4:No), flow moves to S15. At S15, all relevant data (all data related to recording operation) created in the host control unit 107 is inputted into the RAM in the host control device, the data storage device 124, and registers (not shown). Dot pattern data defining ejection positions of the red, green and blue liquids to be ejected on the recording medium, for example, as shown in FIGS. 11A to 11C, resolution data, and ejection start position data are inputted. Then, at S16, a process, which achieves rotation angles ϕG, ∠B included in the relevant data, is performed.

The rotation angle θ is an amount of rotation of the nozzle heads 8R, 8G, 8B. The rotation angles ϕG, ϕB are amounts of rotation of output shafts of the servomotors 52 of the position adjusting mechanisms 48 to individually move the nozzle heads 8G, 8B in the sub-scanning direction by each set infinitesimal distance using the respective position adjusting mechanisms 48 via the sliding mechanisms 47, when positions of green and blue dots are slightly shifted in the sub-scanning direction by one pixel with respect to a red dot. By performing the process of S16 the nozzle heads 8G, 8B are moved in the sub-scanning direction by the set infinitesimal distances. After S16, flow moves to S5 and S17 simultaneously. Then, the processes of S5 and the subsequent steps are performed in parallel with the processes of S17 to S20.

As shown in FIGS. 22 and 23, at S17, the glass substrate 4 is conveyed to the substrate holder 21 and located on the standby position 21b shown in FIG. 2, by the loader H and then is mounted to the substrate holder 21 by being sucked to the substrate holder 21. Then, the substrate holder 21 and the glass substrate 4 are moved to an automatic alignment starting position by controlling the substrate holder 21 and the glass substrate 4 with respect to the X-, Y- and α-axes (rotation about the pin 22) (S18). The automatic alignment mechanism 36 obtains amounts of travel for correction ΔX, ΔY, Δα and initializes the glass substrate 4 and the substrate holder 21 to the home position by correcting their positions according to the obtained amounts of travel for correction ΔX, ΔY, Δα (S19). After that, a recording operation starting point of the glass substrate is positioned to the reference nozzle 51-1 by the X- and Y-direction substrate moving mechanisms 20, 19 (S20). Then, flow moves to S23.

The processes of S23 and subsequent steps will now be described. After both the processes of S20 and S22 are finished, the processes of S23 and subsequent steps are performed. At S23, it is determined whether the ejection condition is normal. When it is determined that the ejection condition is normal (S23:Yes), normal recording operation is performed at S24. During the normal recording operation, the glass substrate 4 and the nozzle heads 8 are relatively moved in the main and sub-scanning directions to form a pattern on the glass substrate 4. Then, flow moves to S25. At S23, when it is determined that the ejection condition is not normal (S23:No), skip recording operation is performed (S28). In the skip recording operation, the recording operation is performed with some of the nozzles 51 controlled to not actuate. For example, first, one path of recording operation is performed using only odd numbered nozzles, such as the nozzle nos. 1, 3, 5 . . . , and then one path of interlace recording operation is performed.

At S29, data for a substitute nozzle recording operation is created and inputted into a page memory of the data storage device 124 and registers (S29). In the substitute nozzle recording, for example, when the nozzle nos. 1 and 2 are not available, the nozzle nos. 3 and 4 are used as substitutes for the nozzle nos. 1 and 2 to additionally perform the recording operation. At S30, the recording operation is performed using substitute nozzles, and then flow moves to S25. At S25, history data of the glass substrate 4 currently processed is recorded in the memory of the host control unit 107. Then, at S26, the rotation angle θ of the nozzle heads 8 is initialized to 0 degree by the three rotation servomotors 49. At S27, the nozzle head holding device 7 is raised to the standby position (home position) HP by the Z-direction head holder moving mechanism 6. After that, flow returns to S3.

In parallel with S26 and S27, the substrate holder 21 and the glass substrate 4 are moved to the standby position 21b, shown in FIG. 2, by the X- and Y-direction substrate moving mechanism 20, 19 (S31). Then, at S32, the substrate lifting mechanism 23 lifts the glass substrate 4 from the substrate holder 21 by a predetermined distance to pass the glass substrate 4 to loader H. Next, at S33, the substrate holder 21 and the glass substrate 4 are moved by the amounts of travel for correction $\Delta X$, $\Delta Y$, $\Delta \alpha$ in a direction opposite to the direction that the substrate holder 21 and the glass substrate 4 are moved at S19. Then, flow returns to S3.

Next, the ejection condition check process will be described. As shown in FIG. 24, the ejection condition control starts, and then at S40, it is determined whether the head portion 43 of the head holding device 7 is placed at the raised position by the Z-direction head holder moving mechanism 6. When the head portion 43 is not placed at the raised position (S40:No), the head portion 43 is moved to the raised position by the Z-direction head holder moving mechanism 6 (S41). When the head portion 43 is placed at the raised position (S40:Yes) or after S41, it is determined whether the head maintenance mechanism 54 is placed at the checking position (S42). When the head maintenance mechanism 54 is not placed at the checking position (S42:No), the head maintenance mechanism 54 is moved to the checking position (S43).

When it is determined that the head maintenance mechanism 54 is placed at the checking position (S42:Yes) or after S43, the ejection condition check is performed with respect to the nozzle heads 8R, 8G, 8B (S44 to S46). The details of the ejection condition check will be described later. Next, the Y-direction camera moving mechanism 71a, the Y-direction flash moving mechanism 71b, and the scanning position switching mechanisms 72a, 72b of the ejection check mechanism 53 are moved to their own standby positions, that is, the CCD camera 73 and the flashing device 74 are moved to their standby positions (S47). After that, the head maintenance mechanism 54 is moved to the standby position (S48). At that time, control is finished.

The ejection condition check with respect to the nozzle heads 8R, 8G, 8B will be described with reference to FIG. 25. The ejection condition check is performed on all the nozzle heads 8R, 8G, 8B in a similar manner. Accordingly, as an example, only the ejection condition check of the nozzle head 8R will be described below.

As shown in FIG. 25, the ejection condition check starts, and then, first, a position Ri (is 1, . . . ,4) is set to a scanning position register (S50). The CCD camera 73 and the flashing device 74 are moved to the position Ri using the Y-direction camera moving mechanism 71a, the Y-direction flash moving mechanism 71b, and the scanning position switching mechanisms 72a, 72b of the ejection check mechanism 53 (S51). Then, an ejection command is issued to sixteen nozzles 51 in an i-th group of the nozzle head 8R (S52). The position Ri corresponds to the nozzles 51 in the i-th group. A counter i is set to 1 at S50.

After S52, a time T1$\alpha$ and a time T2$\beta$ are set to a timer T1 and a timer T2, respectively. At S53, it is determined whether an elapsed time equals or exceeds the set time T1$\alpha$. When it is determined that the elapsed time equals or exceeds the set time T1$\alpha$ (S53:Yes), a shutter of the CCD camera 37 is released to perform scanning (S54). At S55, it is determined whether an elapsed time equals or exceeds the set time T2$\beta$. When it is determined that the elapsed time equals or exceeds the set time T2$\beta$ (S55:Yes), the flashing device 74 actuates to flash for scanning (S56). The set time T1$\alpha$ and set time T2$\beta$ are substantially the same infinitesimal (very small) time.

After the processes of S54 and S56, the image data of the liquid ejection condition of the sixteen nozzle 51 is processed to determine whether the ejection condition is normal, and the check results are displayed on a display of the operating panel 108 (S57). When an image of a liquid droplet is within the observation window 83 of the CCD camera 73, it is determined that the ejection condition is normal. On the other hand, when an image of a liquid droplet is out of the observation window 83, it is determined that the ejection condition is not normal. The determination is made for each nozzle 51. Then, the counter i is incremented by one (S58). After that, it is determined whether the scanning of ejection from the nozzles 51 in all groups (first to fourth groups) is complete (S59). When a negative judgement is made (S59:No), flow goes back to S51 and the subsequent steps are performed. As described above, the ejection condition check is performed on the nozzles 51 in groups of sixteen nozzles, from the first group through the fourth group, in order. When the ejection condition check with respect to all the groups is finished (S59:Yes), the CCD camera 73 and the flashing device 74 are moved to the standby position (S60). Then, the control is finished.

When a pattern is formed on the glass substrate 4, the nozzle heads 8R, 8G, 8B are rotated at the same time in the sub-scanning direction by the three rotation servomotors 49. With this structure, an ejection pitch in the sub-scanning direction is adjusted to a desired ejection pitch by moving the nozzle heads 8R, 8G, 8B in the sub-scanning direction. After that, one path of a recording operation is performed by moving the nozzle head holding device 7 in the main scanning direction relative to the glass substrate 4. Then, the nozzle head holding device 7 is moved in the sub-scanning direction relative to the glass substrate 4 and one path of the recording operation is performed. The above-described operation is performed by turn to form the pattern on the glass substrate 4.

In particular, the plurality of the sliding mechanisms 47, which slidably support the respective support members 46 in the sub-scanning direction, are provided. In addition, the rotation servomotors 49, which rotate the nozzle heads 8 with respect to the support members 46, are provided. The positions of the support members 46 are finely adjusted in the sub-scanning direction by the position adjusting mechanisms 48. Japanese Laid-Open Patent Publication No. 9-300664 discloses a liquid droplet patterning apparatus that requires manual operation of a fine adjustment screw to adjust a sliding member in a main scanning direction every time a dot pitch (resolution) in the sub-scanning direction is changed. However, because the liquid droplet patterning apparatus 1 of the embodiment the invention has the above-describe structure, it is unnecessary to manually operate such a fine adjustment screw every time a dot pitch (resolution) in the sub-scanning direction is changed. Further, the nozzle heads 8 can be speedly rotated to a desired rotation angle.

Accordingly, a wide range of the dot pitches can be obtained by the rotation of the nozzle heads 8, so that the resolution can be set to various levels. The nozzle heads 8 are rotatably supported by the respective support members 46, so that the nozzle heads 8 can be easily attached to and detached from the support members 46. Thus, the maintainability of the nozzle heads 8 can be improved.

A position adjusting controller that can individually control the plurality of the position adjusting mechanisms 48 is provided. Therefore, a position in the sub-scanning direction of each of the support members 46 is individually controlled by the corresponding position adjusting mechanisms 48, so that the positions of the support members 46 can be accurately, finely adjusted. That is, when the nozzle heads 8R, 8G, 8B are rotated by an angle $\theta$ in accordance with a desired resolution, a position of the reference nozzle 51-1 of each of the nozzle heads 8R, 8G, 8B is not changed. Ejection dot patterns with respect to the recording medium (glass substrate 4) are shown in FIGS. 11A to 11C. Positions of a red liquid droplet, a blue liquid droplet and a green liquid droplet are shifted with respect to each other, so that the nozzle heads 8 are adjusted in the sub-scanning direction by the position adjusting mechanisms 48. In this adjustment, with respect to a position of the reference nozzle 51-1 in a specific nozzle head 8 (for example, the nozzle head 8R), positions of the reference nozzles 51-1 in the other nozzle heads 8 (for example, the nozzle head 8G, 8B) are adjusted in the sub-scanning direction. By doing so, a line of patterning, which includes the red R, green G and blue B dots, can be easily performed by one path of the recording operation in the main scanning direction.

In addition, the plurality of the rotation servomotors 49 are controlled to rotate by a specified angle at the same time, so that the plurality of nozzle heads 8, aligned in the main scanning direction at predetermined intervals, do not interfere with each other. The plurality of the nozzle heads 8 include the nozzle heads that each ejects respective colored liquid droplets for forming an EL emitter layer. Accordingly, it is unnecessary to provided a process for forming an EL emitter layer separately. Thus, the throughput of the liquid droplet patterning apparatus 1 can be improved, so that an EL substrate can be produced in full color.

A variation, which is partially different from the above-described embodiment, will be described. Nozzle heads may include a nozzle head that ejects liquid droplets for forming a hole transport layer. However, when a hole transport component is combined with an EL emitter component in liquid to form a layer including the hole transport component and the EL emitter component, the hole transport layer may not be formed separately. The three support members may be slidably supported by a single base plate. Instead of the medium conveying mechanism 24, a mechanism that moves the nozzle heads 8 and the glass substrate 4 relative to each other in the X- and Y-directions (main scanning direction and sub-scanning direction) can be provided. For example, it can be that the nozzle heads 8 are moved in the main scanning direction and the substrate holder 21 is moved in the sub-scanning direction.

Although the invention has been described in detail with reference to a specific embodiment thereof, it will be apparent to those skilled in the art that various changes and modifications may be made therein without departing from the spirit of the invention.

What is claimed is:

1. A liquid droplet patterning apparatus, comprising:
   a plurality of nozzles that eject liquid droplets onto a recording medium,
   a plurality of nozzle heads that are aligned in a main scanning direction, at predetermined intervals, and have the plurality of the nozzles aligned in a sub-scanning direction orthogonal to the main scanning direction;
   a plurality of support members that rotatably support the respective nozzle heads;
   a plurality of rotation devices that rotate the respective nozzle heads about an axis extending in a direction parallel to the liquid droplet ejecting direction and orthogonal to the nozzle alignment direction, with respect the support members;
   a plurality of sliding mechanisms that slidably support the plurality of the support members in the sub-scanning direction; and
   a plurality of position adjusting devices that finely adjust the respective support members, which support the nozzle heads, via the sliding mechanisms, in the sub-scanning direction.

2. The liquid droplet patterning apparatus according to claim 1, further comprising a position adjusting mechanism controller that controls the plurality of the position adjusting mechanisms individually.

3. The liquid droplet patterning apparatus according to claim 2, further comprising a rotation device controller that controls the rotation devices so that the rotation devices rotate the nozzle heads by a set angle at the same time.

4. The liquid droplet patterning apparatus according to claim 1, wherein the plurality of the nozzle heads, each nozzle head ejecting liquid droplets of a color of a plurality of colors to form an electroluminescence emitter layer that emits light of a plurality of predetermined colors.

5. The liquid droplet patterning apparatus according to claim 1, wherein the plurality of the nozzle heads includes a nozzle head that ejects a liquid droplet for forming a hole transport layer.

6. An apparatus that creates droplet patterns on a recording medium, comprising:
   a movable member;
   a mounting member mounted to the movable member;
   a plurality of base plates, associated with each base plate is:
      a support member slidably mounted to the base plate;
      a movement mechanism that slides the support member in a first direction away from the movable member and a second direction opposite to the first direction;
      a rotation member at an end of the support member away from where the support member is slidably mounted to the base plate, the rotation member having an output shaft;
      a head holder mounted to an end of the rotation shaft; and
      a nozzle head with a plurality of nozzles mounted to a side of the head holder opposite to the mounting to the rotation shaft; and
   a control unit that determines and controls movement of each of the movement mechanism and the rotation member.

7. The apparatus according to claim 6, wherein the first and second directions are in a sub-scanning direction of the apparatus.

8. The apparatus according to claim 7, further comprising a second movement mechanism that moves the movable member in a third direction and a fourth direction opposite to the third direction, the third and fourth directions perpendicular to the first and second directions.

9. The apparatus according to claim 8, wherein the rotation member can rotate the head holder between at least 0° and ±30° relative to the first and second directions.

10. The apparatus according to claim 6, wherein the movement mechanism comprises a servomotor.

11. The apparatus according to claim 10, the movement mechanism further comprising a threaded output shaft received in an internally threaded opening of the support member.

12. The apparatus according to claim 6, wherein a first nozzle of the nozzle head is aligned with an axis of the output shaft of the rotation member.

13. The apparatus according to claim 12, wherein the plurality of nozzles extend along the nozzle head away from the movable member and the axis.

14. The apparatus according to claim 6, wherein the control unit determines and controls movement of the movable member in a fifth direction and a sixth direction opposite to the fifth direction, the fifth and sixth directions transverse to each of the first through fourth directions.

15. The apparatus according to claim 6, wherein the rotation member can rotate the head holder between at least 0° and ±30° relative to the first and second directions.

16. The apparatus according to claim 15, wherein 0° is aligned with the first and second directions.

17. The apparatus according to claim 15, wherein the control unit controls each rotation member to rotate the head holder such that all head holders rotate by a set angle at the same time.

18. The apparatus according to claim 6, wherein there are three base plates.

19. The apparatus according to claim 18, wherein the control unit controls each rotation member to rotate the head holder such that all head holders rotate by a set angle at the same time.

20. The apparatus according to claim 18, wherein each nozzle head associated with a base plate of the three base plates ejects a different color electroluminescent ink.

* * * * *